US010547016B2

(12) United States Patent
Tashiro

(10) Patent No.: US 10,547,016 B2
(45) Date of Patent: Jan. 28, 2020

(54) PHOTOELECTRIC CONVERSION APPARATUS AND IMAGING SYSTEM

(71) Applicant: CANON KABUSHIKI KAISHA, Tokyo (JP)

(72) Inventor: Kazuaki Tashiro, Isehara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/076,632

(22) PCT Filed: Dec. 26, 2016

(86) PCT No.: PCT/JP2016/088660
§ 371 (c)(1),
(2) Date: Aug. 8, 2018

(87) PCT Pub. No.: WO2017/138273
PCT Pub. Date: Aug. 17, 2017

(65) Prior Publication Data
US 2019/0067612 A1    Feb. 28, 2019

(30) Foreign Application Priority Data
Feb. 9, 2016  (JP) ................................. 2016-023061

(51) Int. Cl.
*H01L 27/146* (2006.01)
*H01L 51/42* (2006.01)
(Continued)

(52) U.S. Cl.
CPC ...... *H01L 51/4273* (2013.01); *H01L 27/1461* (2013.01); *H01L 27/14692* (2013.01);
(Continued)

(58) Field of Classification Search
None
See application file for complete search history.

(56) References Cited

U.S. PATENT DOCUMENTS 7,564,079 B2 * 7/2009 Mabuchi ........... H01L 27/14632
257/225
8,836,839 B2 * 9/2014 Choo .................... H01L 51/424
348/308

(Continued)

FOREIGN PATENT DOCUMENTS

| EP | 0660421 A2 | 6/1995 |
|---|---|---|
| EP | 2858347 A1 | 4/2015 |
| WO | 2012/004923 A1 | 1/2012 |

*Primary Examiner* — Minh Loan Tran
(74) *Attorney, Agent, or Firm* — Canon U.S.A., Inc. IP Division

(57) ABSTRACT

A photoelectric conversion apparatus according to an embodiment includes a semiconductor substrate, a first electrode layer disposed on the semiconductor substrate, a second electrode layer disposed between the first electrode layer and the semiconductor substrate, an accumulation layer disposed between the first electrode layer and the second electrode layer and configured to accumulate signal electric charges generated by photoelectric conversion, an insulating layer disposed between the accumulation layer and the second electrode layer, a blocking layer disposed between the accumulation layer and the insulating layer and configured to prevent the signal electric charges in the accumulation layer from reaching the insulating layer, and a circuit unit disposed in the semiconductor substrate and connected to the second electrode layer to receive a signal based on the signal electric charges.

34 Claims, 13 Drawing Sheets

(51) Int. Cl.
  *H01L 27/30*   (2006.01)
  *H04N 5/363*   (2011.01)
  *H01L 31/0224*  (2006.01)
  *H04N 5/357*   (2011.01)
  *H01L 31/0232*  (2014.01)
  *H04N 5/369*   (2011.01)
  *H04N 5/374*   (2011.01)

(52) U.S. Cl.
  CPC ........ *H01L 27/307* (2013.01); *H01L 31/0224* (2013.01); *H01L 31/0232* (2013.01); *H01L 51/4293* (2013.01); *H04N 5/357* (2013.01); *H04N 5/363* (2013.01); *H04N 5/3696* (2013.01); *H04N 5/374* (2013.01)

(56) References Cited

U.S. PATENT DOCUMENTS

| | | | |
|---|---|---|---|
| 9,231,019 B2 * | 1/2016 | Shimotsusa | H01L 27/1463 |
| 9,722,107 B2 * | 8/2017 | Tashiro | H01L 31/0232 |
| 2006/0187327 A1 | 8/2006 | Mabuchi | |
| 2013/0093932 A1 | 4/2013 | Choo | |
| 2014/0367668 A1 * | 12/2014 | Fujii | H01L 27/14627 |
| | | | 257/40 |
| 2016/0013328 A1 | 1/2016 | Tashiro | |

\* cited by examiner

[Fig. 1]
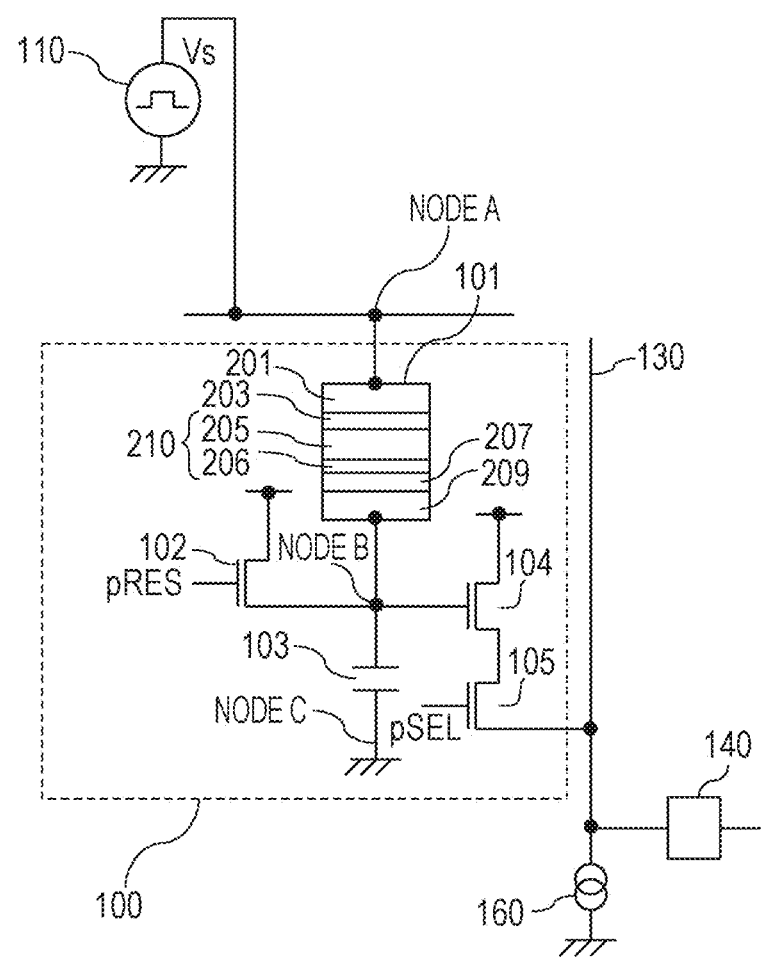

[Fig. 2]
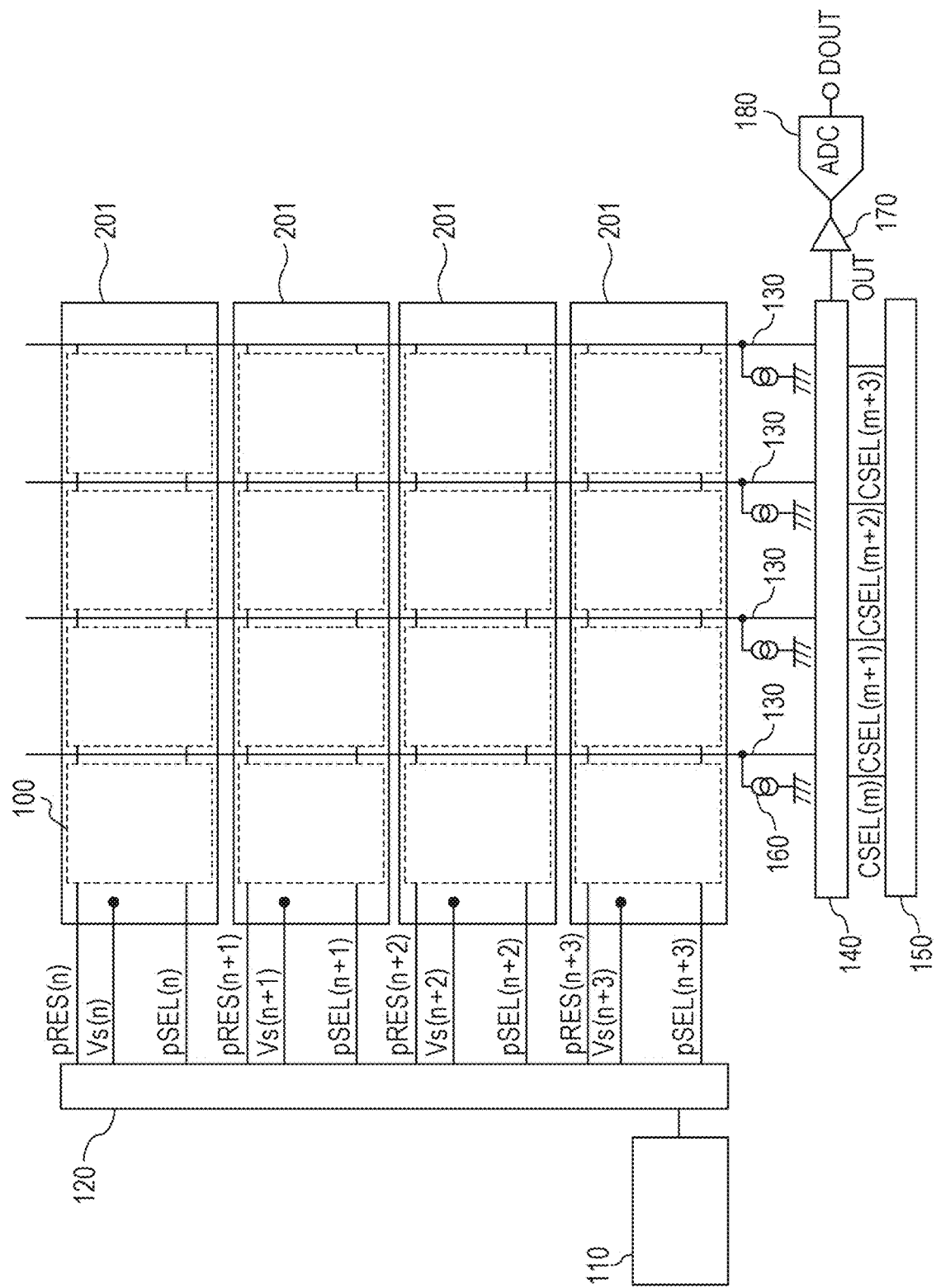

[Fig. 3]
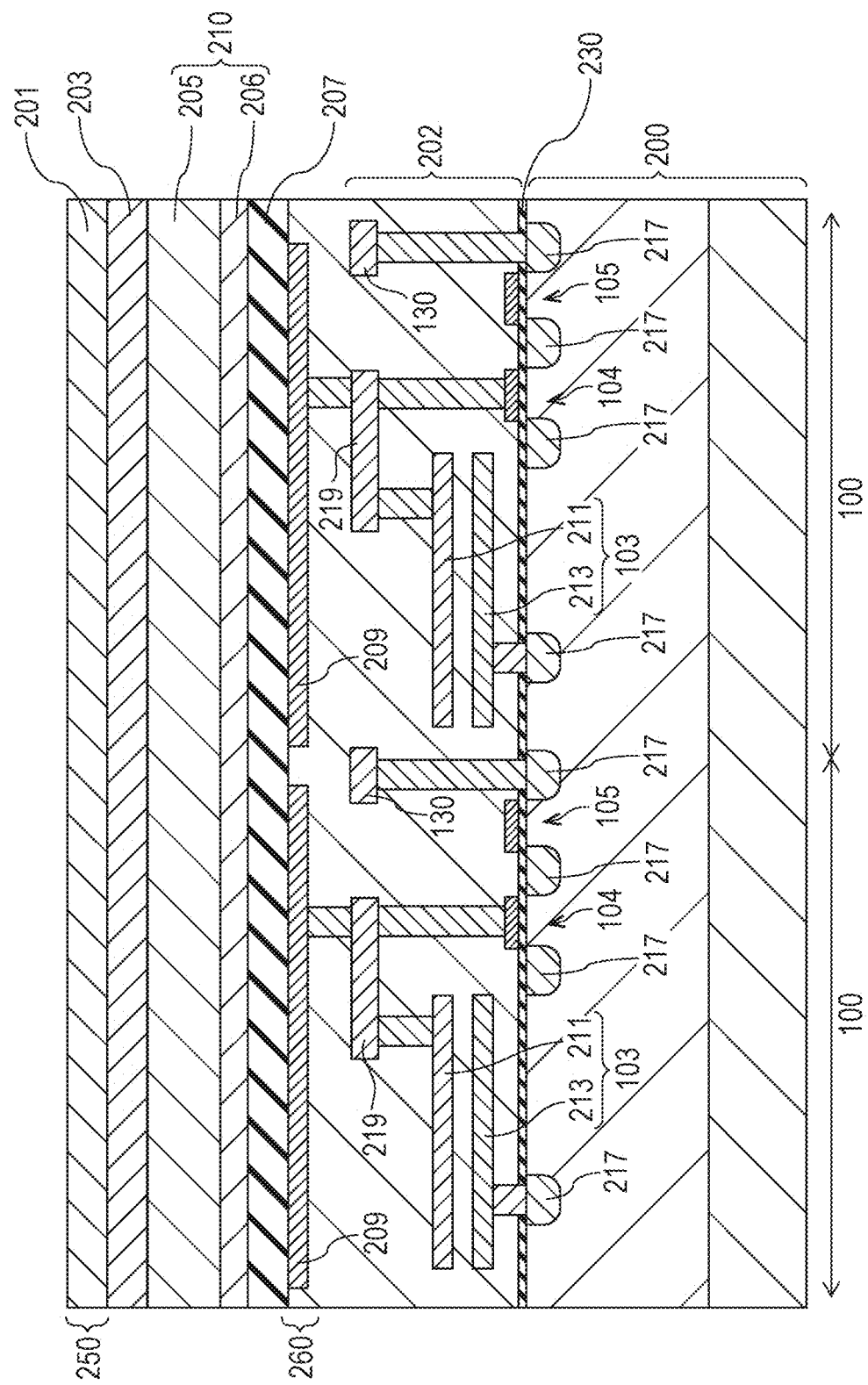

[Fig. 4A]
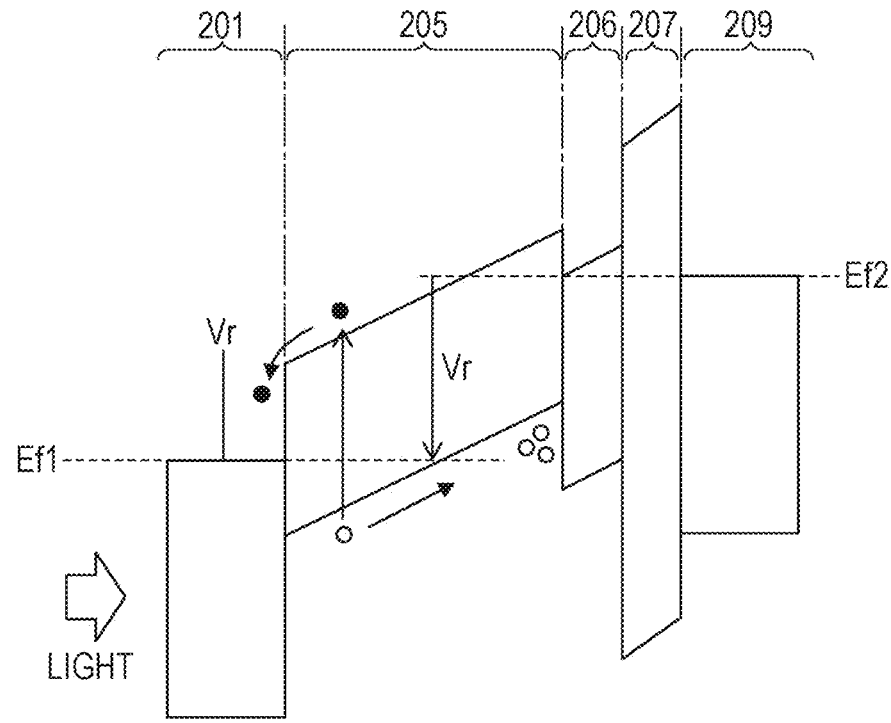
[Fig. 4B]
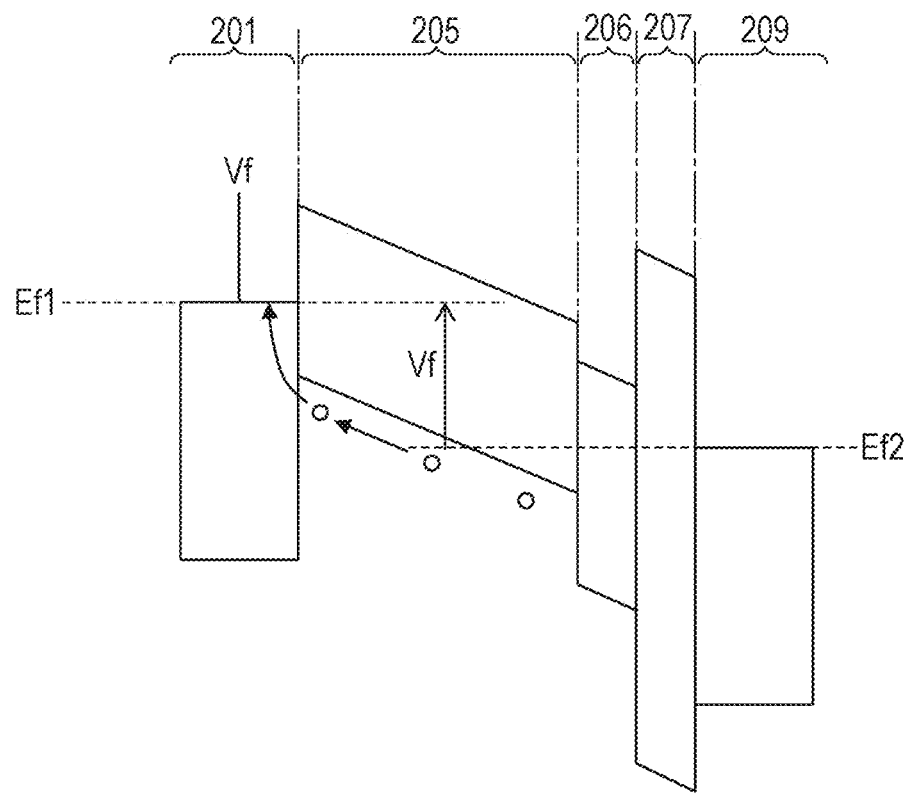

[Fig. 5A]
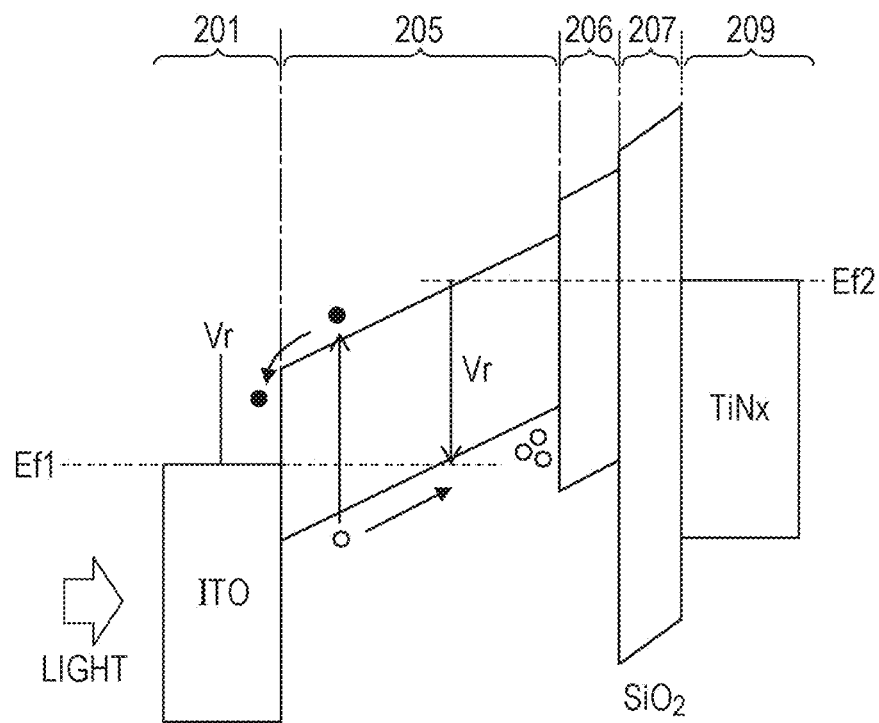
[Fig. 5B]
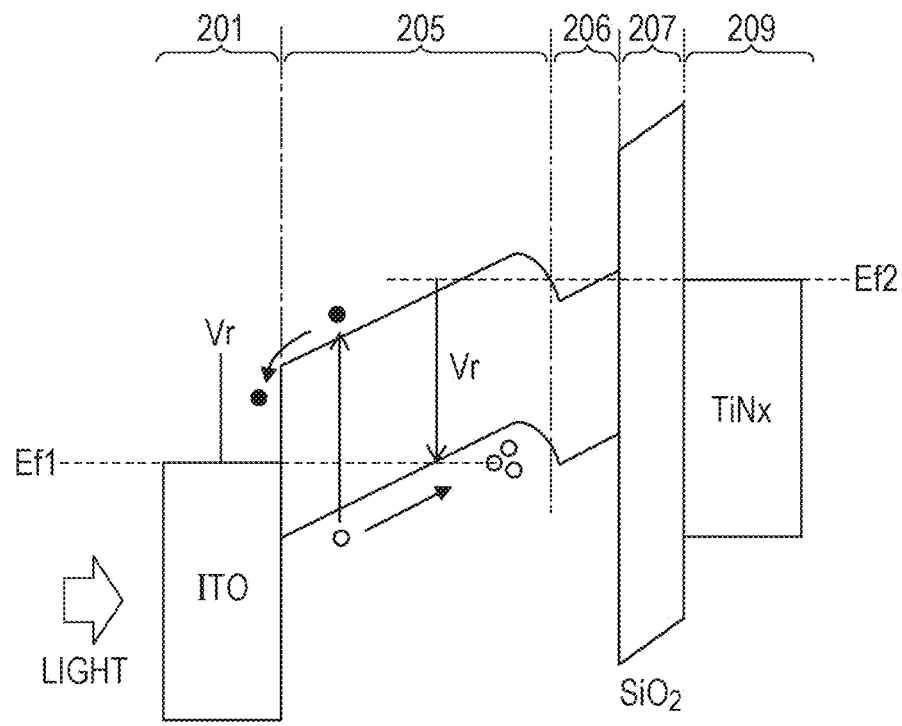

[Fig. 6A]
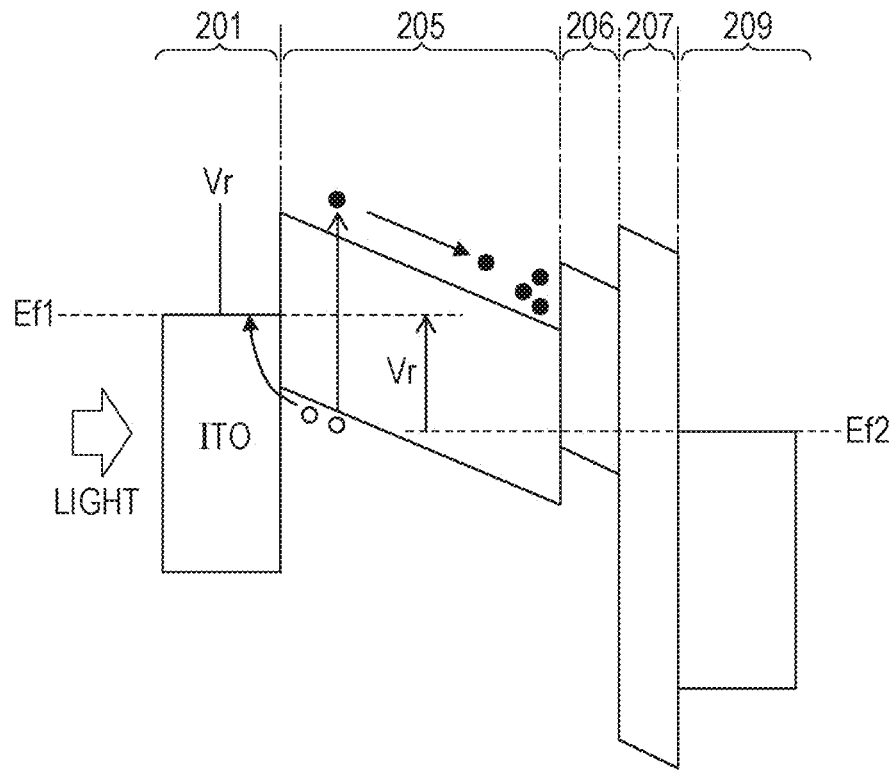
[Fig. 6B]
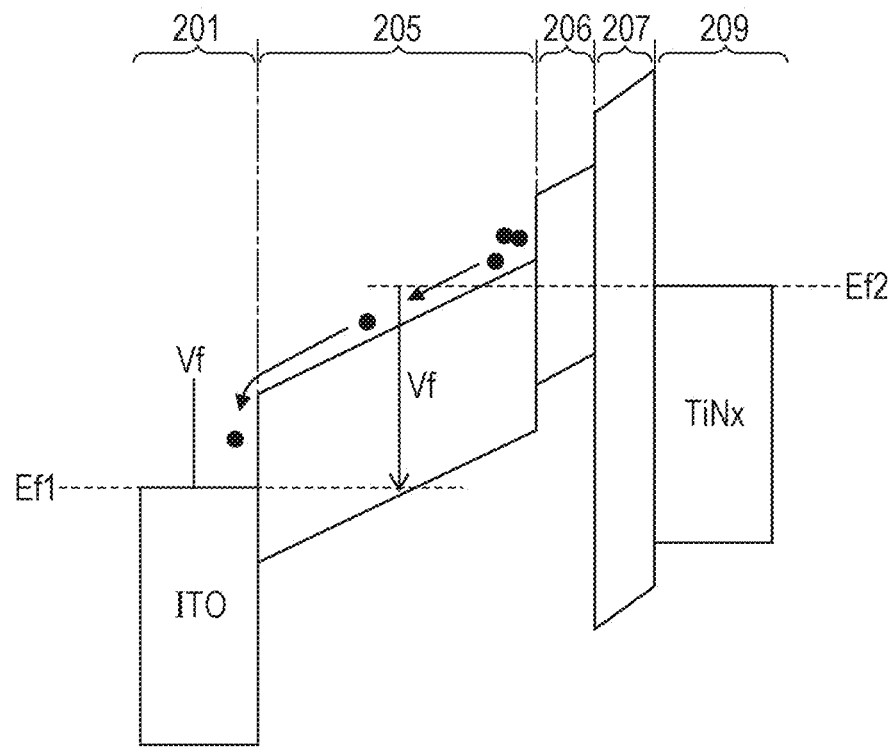

[Fig. 7A]
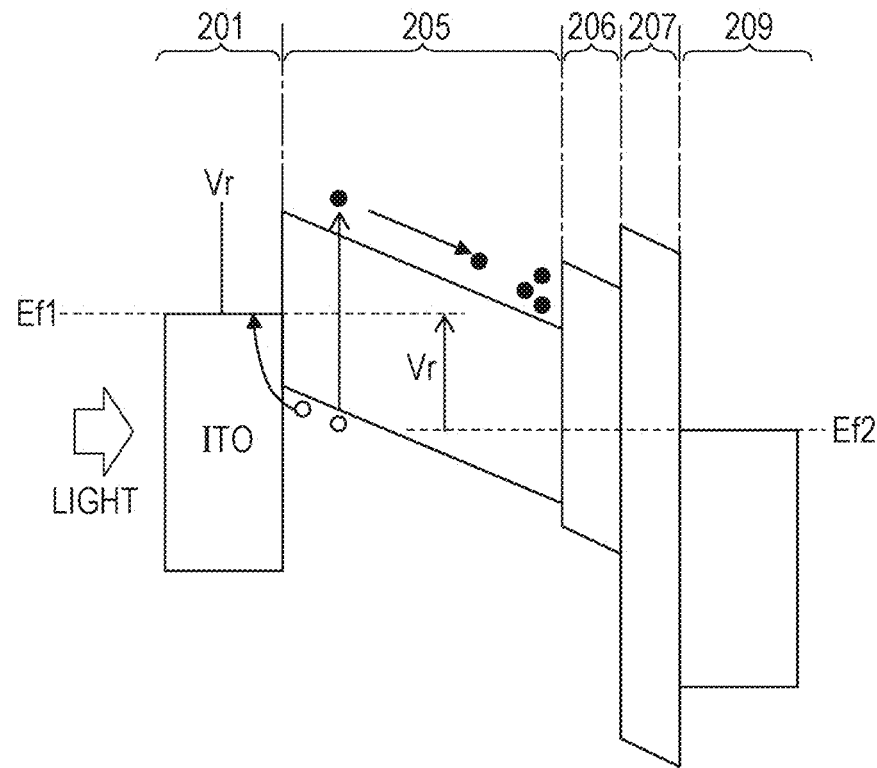
[Fig. 7B]
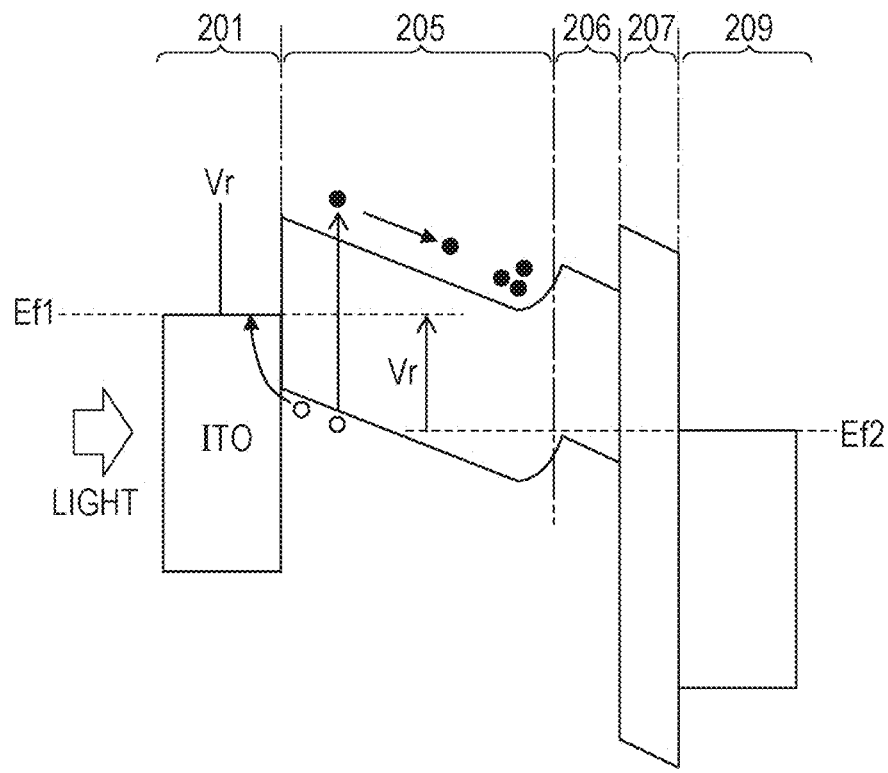

[Fig. 8]
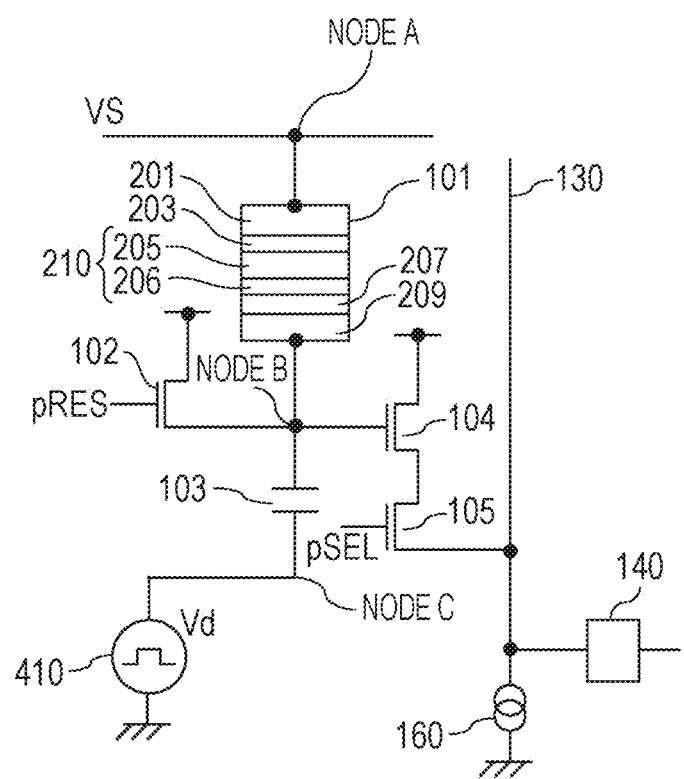

[Fig. 9]
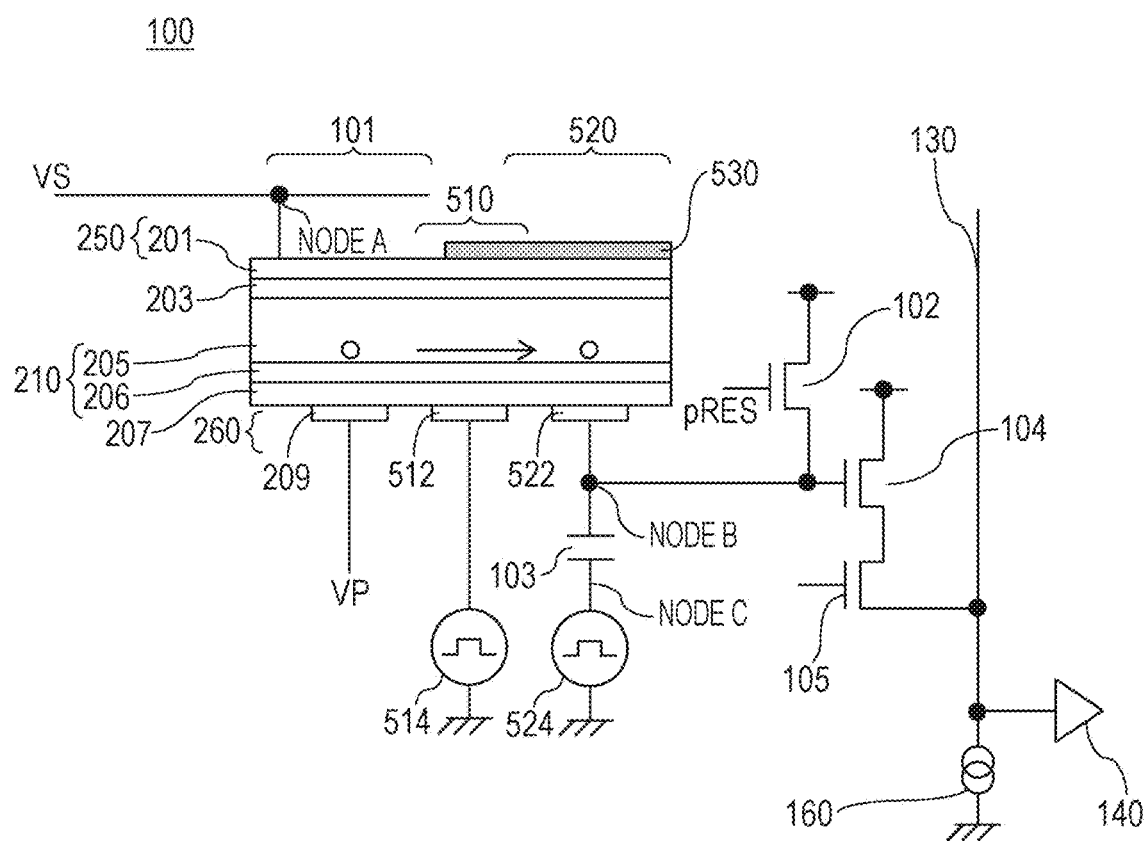

[Fig. 10]
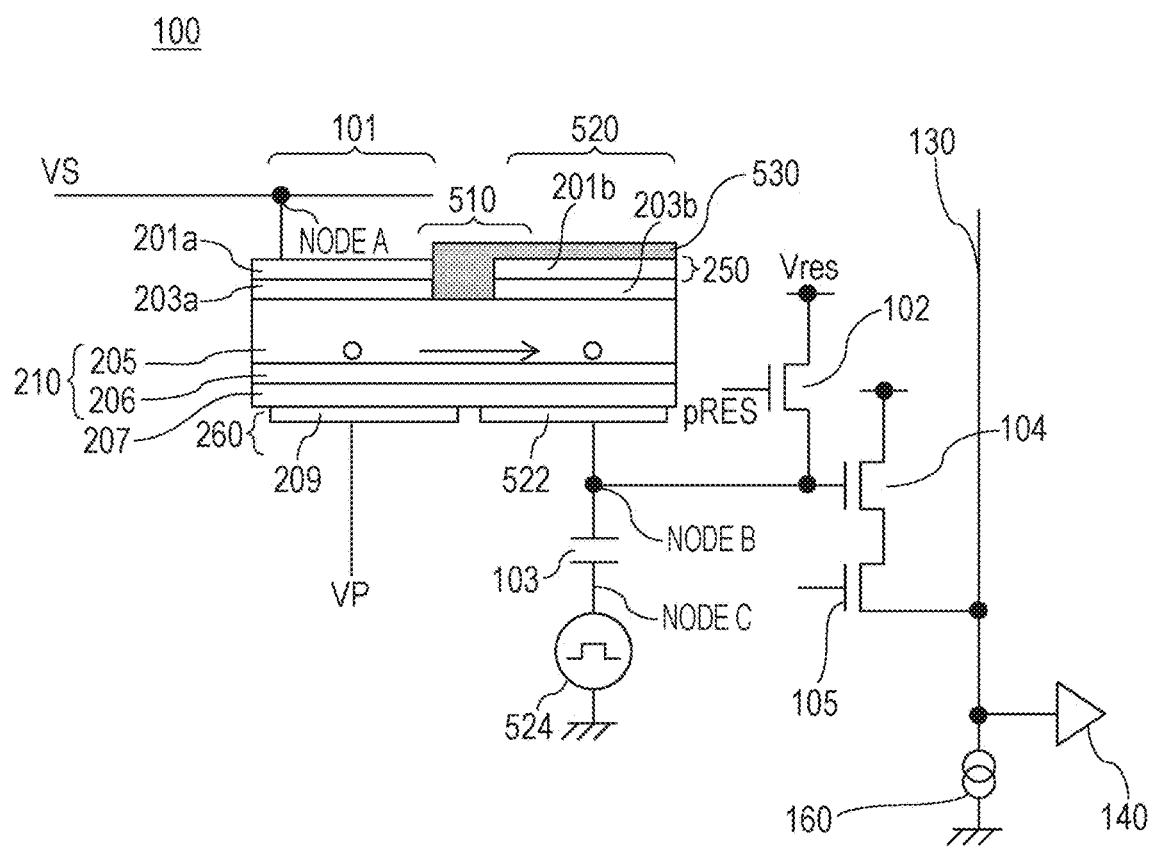

[Fig. 11]
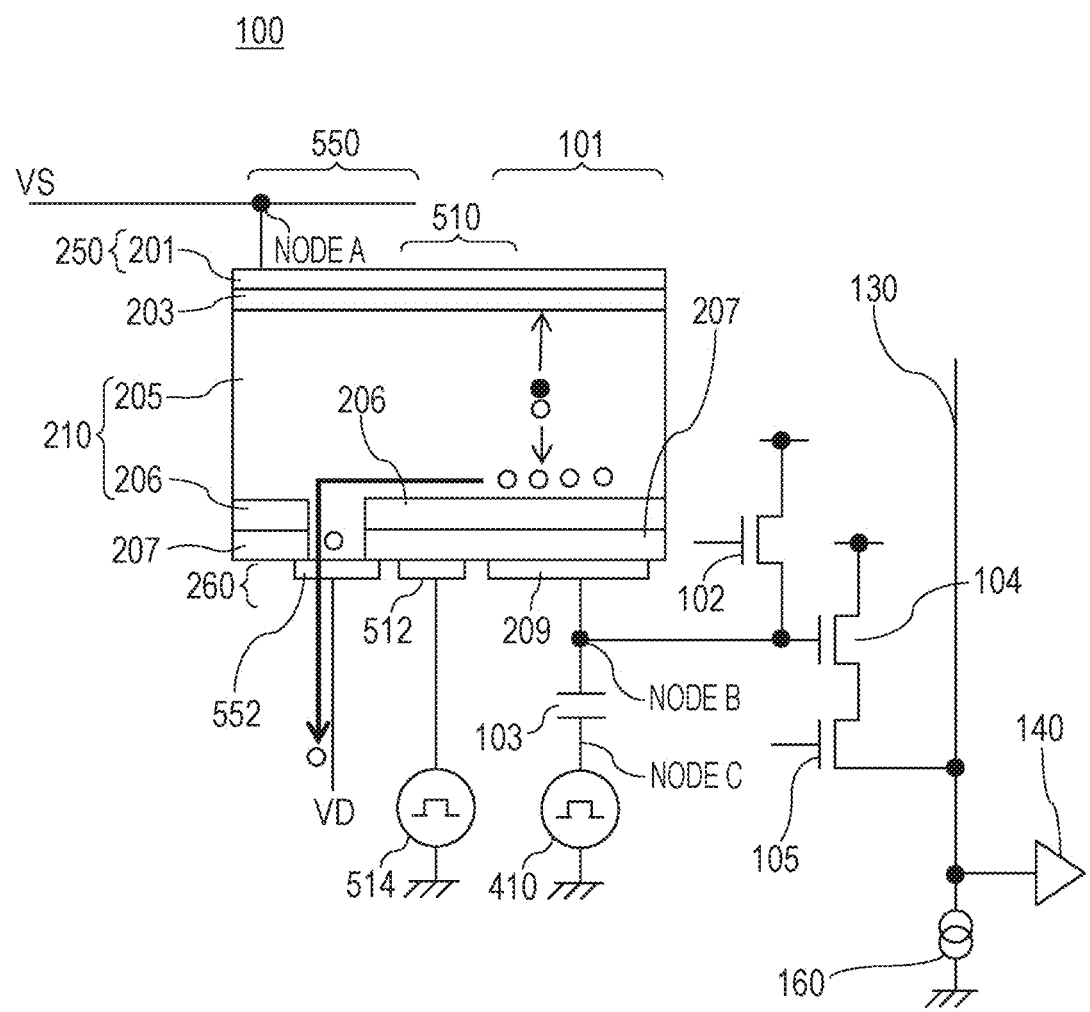

[Fig. 12]
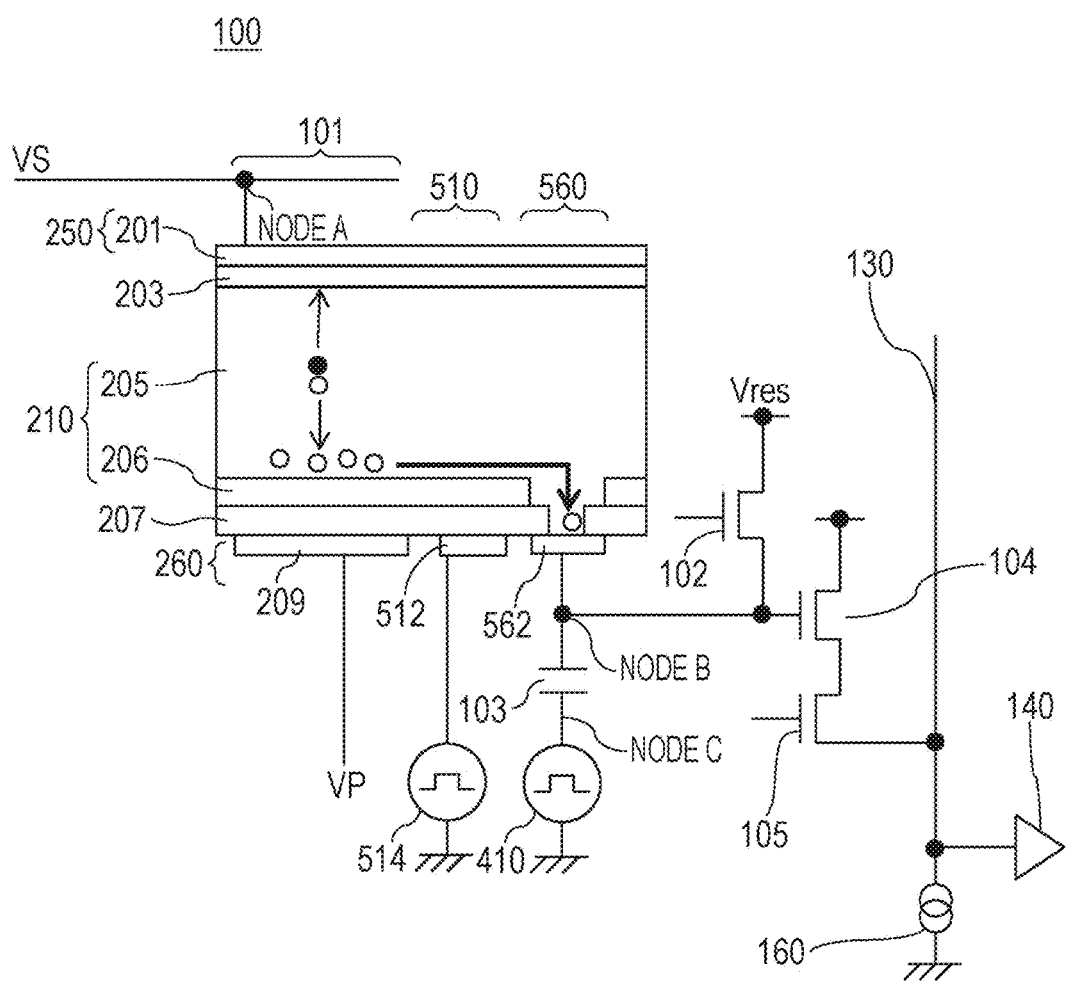

[Fig. 13]
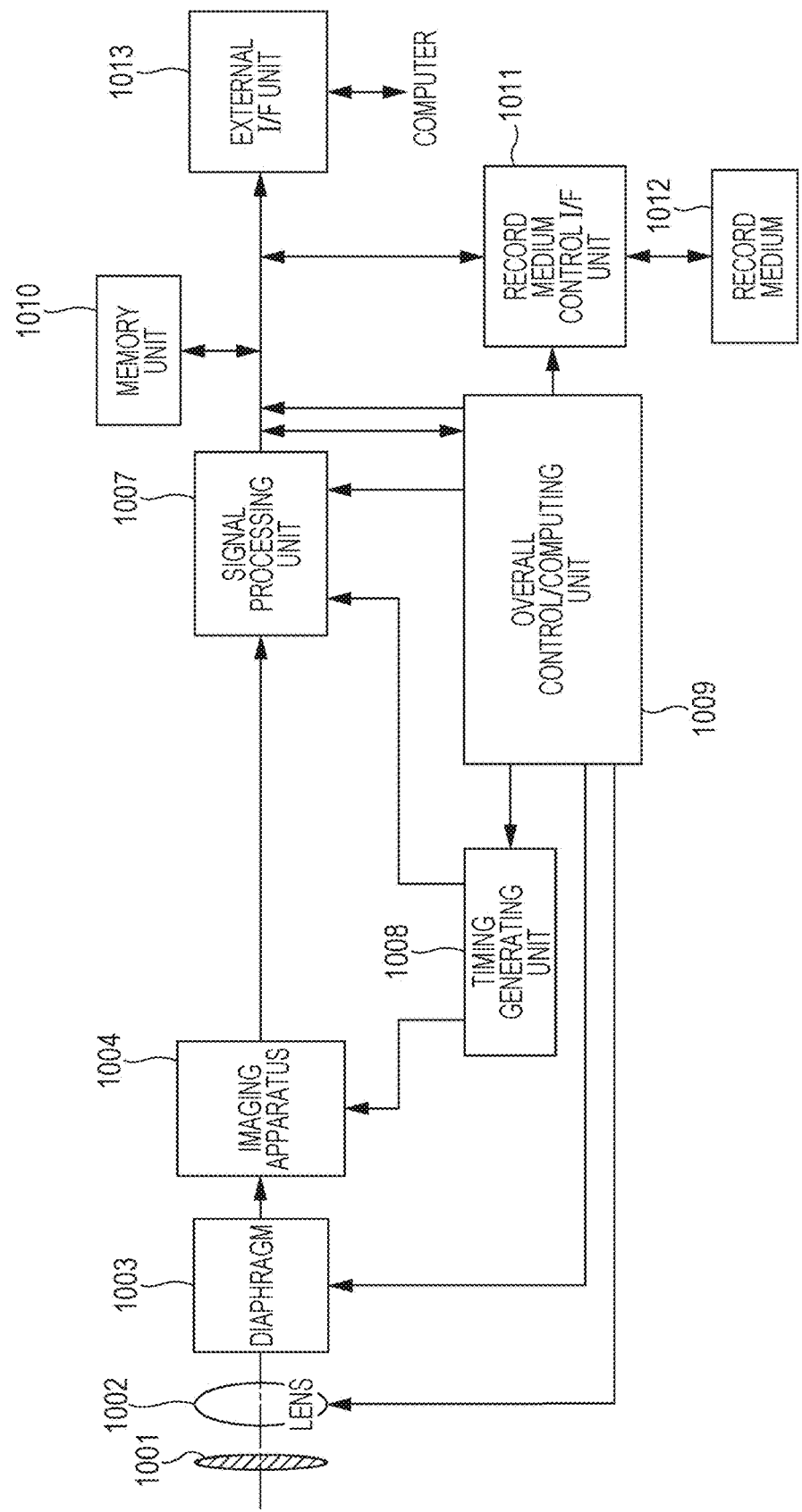

US 10,547,016 B2

PHOTOELECTRIC CONVERSION APPARATUS AND IMAGING SYSTEM

TECHNICAL FIELD

The present invention relates to a photoelectric conversion apparatus and an imaging system.

BACKGROUND ART

A stacked photoelectric conversion apparatus has been proposed as a photoelectric conversion apparatus applicable in an image sensor in a camera, for example. In a photoelectric conversion apparatus disclosed in PTL 1, FIG. 1, a photoelectric conversion film is stacked on a semiconductor substrate. A transparent electrode is disposed on the photoelectric conversion film, and a pixel electrode is disposed under the photoelectric conversion film. An insulating film is disposed between the photoelectric conversion film and the pixel electrode. According to PTL 1, this configuration can implement correlated double sampling so that noise can be reduced.

CITATION LIST

Patent Literature

PTL 1: WO2012/004923

SUMMARY OF INVENTION

Solution to Problem

An embodiment according to one aspect of the present disclosure provides a photoelectric conversion apparatus including a semiconductor substrate, a first electrode layer disposed on the semiconductor substrate, a second electrode layer disposed between the first electrode layer and the semiconductor substrate, an accumulation layer disposed between the first electrode layer and the second electrode layer and configured to accumulate signal electric charges generated by photoelectric conversion, an insulating layer disposed between the accumulation layer and the second electrode layer, a blocking layer disposed between the accumulation layer and the insulating layer and configured to prevent the signal electric charges in the accumulation layer from reaching the insulating layer, and a circuit unit disposed in the semiconductor substrate, the circuit unit being connected to the second electrode layer to receive a signal based on the signal electric charges.

An embodiment according to another aspect of the present disclosure provides a photoelectric conversion apparatus including a semiconductor substrate, a first electrode layer disposed on the semiconductor substrate, a second electrode layer disposed between the first electrode layer and the semiconductor substrate, an accumulation layer disposed between the first electrode layer and the second electrode layer and configured to accumulate signal electric charges generated by photoelectric conversion, an insulating layer disposed between the accumulation layer and the second electrode layer;
a blocking layer disposed between the accumulation layer and the insulating layer and having a potential barrier against the signal electric charges in the accumulation layer, and a circuit unit disposed in the semiconductor substrate, the circuit unit being connected to the second electrode layer to receive a signal based on the signal electric charges.

An embodiment according to another aspect of the present disclosure provides a photoelectric conversion apparatus including a semiconductor substrate, a first electrode layer disposed on the semiconductor substrate, a second electrode layer disposed between the first electrode layer and the semiconductor substrate, a photoelectric conversion layer disposed between the first electrode layer and the second electrode layer, an insulating layer disposed between the photoelectric conversion layer and the second electrode layer, and a circuit unit disposed in the semiconductor substrate, the circuit unit being connected to the second electrode layer to receive a signal based on signal electric charges generated in the photoelectric conversion layer, wherein a potential barrier is formed in the photoelectric conversion layer against the signal electric charges moving in a direction from the first electrode layer toward the insulating layer.

Further features of the present invention will become apparent from the following description of embodiments with reference to the attached drawings.

BRIEF DESCRIPTION OF DRAWINGS

FIG. 1 schematically illustrates a configuration of a pixel in a photoelectric conversion apparatus.

FIG. 2 schematically illustrates an overall configuration of the photoelectric conversion apparatus.

FIG. 3 schematically illustrates a cross-sectional structure of the photoelectric conversion apparatus.

FIG. 4A schematically illustrates a potential of a photoelectric converting unit in the photoelectric conversion apparatus.

FIG. 4B schematically illustrates a potential of a photoelectric converting unit in the photoelectric conversion apparatus.

FIG. 5A schematically illustrates a potential of the photoelectric converting unit in the photoelectric conversion apparatus.

FIG. 5B schematically illustrates a potential of the photoelectric converting unit in the photoelectric conversion apparatus.

FIG. 6A schematically illustrates a potential of the photoelectric converting unit in the photoelectric conversion apparatus.

FIG. 6B schematically illustrates a potential of the photoelectric converting unit in the photoelectric conversion apparatus.

FIG. 7A schematically illustrates a potential of the photoelectric converting unit in the photoelectric conversion apparatus.

FIG. 7B schematically illustrates a potential of the photoelectric converting unit in the photoelectric conversion apparatus.

FIG. 8 schematically illustrates a configuration of a pixel in the photoelectric conversion apparatus.

FIG. 9 schematically illustrates a configuration of a pixel in the photoelectric conversion apparatus.

FIG. 10 schematically illustrates a configuration of a pixel in the photoelectric conversion apparatus.

FIG. 11 schematically illustrates a configuration of a pixel in the photoelectric conversion apparatus.

FIG. 12 schematically illustrates a configuration of a pixel in the photoelectric conversion apparatus.

FIG. 13 is a block diagram according to an embodiment of a photoelectric conversion system.

DESCRIPTION OF EMBODIMENTS

A photoelectric conversion apparatus known by the inventors accumulates signal electric charges at an interface between a photoelectric conversion film and an insulating film, as illustrated in FIG. 4B in PTL 1. Such an interface between a photoelectric conversion film and an insulating film may easily have defect levels. During accumulation of signal electric charges, signal electric charges may possibly be trapped by the defect levels. Because discharging such trapped signal electric charges takes time, noise such as an after image may possibly occur.

According to several embodiments, noise can be reduced in a photoelectric conversion apparatus.

An embodiment according to the present invention is a photoelectric conversion apparatus. The photoelectric conversion apparatus includes a semiconductor substrate and a photoelectric conversion layer stacked on the semiconductor substrate. The photoelectric conversion layer is configured such that light that enters to the photoelectric conversion layer can be photoelectrically converted to electric charges. It should be noted that the whole photoelectric conversion layer may not necessarily have a photoelectric conversion function. The semiconductor substrate has thereon a circuit unit configured to receive a signal based on signal electric charges generated in the photoelectric conversion layer. According to several embodiments, the photoelectric conversion apparatus includes a plurality of pixels. In any one of those embodiments, a plurality of circuit units is provided correspondingly to a plurality of pixels. Each of the plurality of circuit units may include an amplifying unit configured to amplify a signal. FIG. 3 illustrates a semiconductor substrate 200 and a photoelectric conversion layer 210. FIG. 1 illustrates an equivalent circuit in the pixel 100 as an example of the circuit unit.

A first electrode layer is disposed on the semiconductor substrate. A second electrode layer is disposed between the first electrode layer and the semiconductor substrate. The photoelectric conversion layer is disposed between the first electrode layer and the second electrode layer. An insulating layer is disposed between the photoelectric conversion layer and the second electrode layer. FIGS. 1 and 3 illustrate a first electrode 201 included in an electrode layer 250, a second electrode 209 included in a second electrode layer 260, and an insulating layer 207.

According to some embodiments, the photoelectric conversion apparatus includes an accumulation layer and a blocking layer. The accumulation layer is configured to accumulate signal electric charges generated by photoelectric conversion. The blocking layer is disposed between the accumulation layer and the insulating layer. The blocking layer is configured to prevent, reduce or hinder entry of signal electric charges in the accumulation layer to the blocking layer. FIG. 1 illustrates an accumulation layer 205 and a blocking layer 206.

The photoelectric conversion layer may include the accumulation layer and the blocking layer. The photoelectric conversion layer may include a layer having a photoelectric conversion function in addition to the accumulation layer and the blocking layer. It should be noted that the accumulation layer and the blocking layer do not necessarily include the photoelectric conversion function. In other words, according to some embodiments, the accumulation layer and the blocking layer may be provided separately from the photoelectric conversion layer.

The photoelectric conversion layer may be formed by stacking the accumulation layer and the blocking layer. Each of the accumulation layer and the blocking layer may be made of a semiconductor material. The semiconductor material may be selected from an inorganic semiconductor material such as silicon, germanium, and gallium arsenide or an organic semiconductor material. The semiconductor material forming the accumulation layer may be different from the semiconductor material forming the blocking layer. Alternatively, a band gap of the semiconductor material forming the accumulation layer may be different from a band gap of the semiconductor material forming the blocking layer. The band gap refers to a difference between a lowest energy level of a conduction band and a highest energy level of a valence band. Because of this configuration, the blocking layer can prevent entry of signal electric charges from the accumulation layer. It should be noted that the materials forming the accumulation layer and the blocking layer are not limited to semiconductor materials.

A photoelectric conversion layer being a monolayer may include a first part and a second part having characteristics different from each other. The second part is disposed between the first part and the insulating layer. Because of this configuration, each of the first part and the second part can function as the accumulation layer and the blocking layer. For example, in an embodiment in which the photoelectric conversion layer is made of a semiconductor material, the first part has an impurity concentration different from the impurity concentration of the second part. Alternatively, in an embodiment in which the photoelectric conversion layer is made of a semiconductor material, the first part has a conductivity type different from the conductivity type of the second part. Because of this configuration, the second part can prevent entry of signal electric charges from the first part. Also with a difference in a characteristic other than the impurity concentration and conductivity type, the second part can prevent entry of signal electric charges from the first part.

In another embodiment, a potential barrier may be formed against signal electric charges moving in a direction from the first electrode layer toward the insulating layer in the photoelectric conversion layer. In other words, a potential barrier is formed which can prevent, reduce or hinder reach of signal electric charges in the photoelectric conversion layer to the insulating layer. The direction from the first electrode layer to the insulating layer may be a direction along a line orthogonal to a surface of the semiconductor substrate, for example. The potential barrier may be formed inside the photoelectric conversion layer or may be formed outside the photoelectric conversion layer.

In an embodiment in which the photoelectric conversion layer is made of a semiconductor material, a potential barrier is formed by a difference in impurity concentration, a difference in size of band gaps, or a difference in conductivity type, for example. Alternatively, a potential barrier can be formed by applying voltage locally to a part of the photoelectric conversion layer.

In an embodiment in which the photoelectric conversion layer is made of an organic material, the potential barrier may be defined by a difference in LUMO (Lowest Unoccupied Molecular Orbital) or difference in HOMO (Highest Occupied Molecular Orbital).

In the blocking layer as described above, a potential barrier may be formed against signal electric charges from the accumulation layer. Thus, in both of an embodiment in which a photoelectric conversion layer is formed by stacking a plurality of layers and an embodiment in which a photoelectric conversion layer is formed by a monolayer including a plurality of parts, a potential barrier can be formed against signal electric charges in the photoelectric conversion layer.

The potential barrier formed in the blocking layer or the photoelectric conversion layer can prevent, reduce or hinder reach of signal electric charges in the photoelectric conversion layer to the insulating layer. Because of this configuration, signal electric charges can be accumulated at a location apart from an interface between the photoelectric conversion layer and the insulating layer. Therefore, the possibility that signal electric charges are trapped by a defect level occurring at the interface while signal electric charges are being accumulated can be reduced. As a result, noise can be reduced.

Embodiments of the present invention will be described in detail below with reference to drawings. The present invention is not limited to the following embodiments only. Variation examples in which partial configurations are changed from the following embodiments without departing from the spirit and scope of the present invention are also included in embodiments of the present invention. Examples in which a partial configuration of any one of the following embodiments is added to another embodiment or is replaced by a partial configuration of another embodiment are also included in embodiments of the present invention.

First Embodiment

A photoelectric conversion apparatus according to a first embodiment will be described. FIG. 1 schematically illustrates a configuration of a pixel 100 in the photoelectric conversion apparatus. The pixel 100 includes a photoelectric converting unit 101, a reset transistor 102, a first capacitance 103, an amplification transistor 104, and a selection transistor 105. The reset transistor 102, the amplification transistor 104, and the selection transistor 105 construct a circuit unit configured to receive a signal based on signal electric charges generated by photoelectric conversion. While FIG. 1 illustrates one pixel 100, the photoelectric conversion apparatus of this embodiment includes a plurality of pixels 100.

The photoelectric converting unit 101 has a first terminal connected to a node A and a second terminal connected to a node B in FIG. 1. The node A is connected to a voltage control unit 110. The voltage control unit 110 controls voltage Vs to be applied to a first terminal of the photoelectric converting unit 101. Because of this configuration, electric charges can be accumulated in the photoelectric converting unit 101, and electric charges can be output or transferred from the photoelectric converting unit 101.

The node B in FIG. 1 is connected to a gate of the amplification transistor 104. The gate of the amplification transistor 104 is an input node of the amplifying unit. Because of this configuration, an amplifying unit can amplify a signal from the photoelectric converting unit 101. In other words, according to this embodiment, the circuit unit configured to receive a signal based on signal electric charges generated by photoelectric conversion includes the amplifying unit.

The first capacitance 103 has a first terminal connected to the node B. The first capacitance 103 has a second terminal connected to a node C. From another point of view, the node C is coupled to the node B through the first capacitance 103. A predetermined amount of voltage is supplied to the node C. According to this embodiment, the second terminal (node C) of the first capacitance 103 is grounded, that is, voltage of 0 V is supplied to the second terminal of the first capacitance 103.

The reset transistor 102 has a drain connected to a node to which a reset voltage Vres is supplied. The reset transistor 102 has a source connected to the second terminal of the photoelectric converting unit 101 and a gate of the amplification transistor 104. Because of this configuration, the reset transistor 102 can reset the voltage at the node B to the reset voltage Vres. In other words, the reset transistor 102 is a reset unit configured to reset voltage at the input node of the amplifying unit. The reset transistor 102 may be turned off so that the node B connected to the second terminal of the photoelectric converting unit 101 can electrically float.

The amplification transistor 104 has a drain connected to a node to which power supply voltage is supplied. The power supply voltage may be the same as or different from the reset voltage Vres. The amplification transistor 104 has a source connected to an output line 130 through the selection transistor 105. A current source 160 is connected to the output line 130. The amplification transistor 104 and current source 160 construct a source follower circuit which outputs a signal from the photoelectric converting unit 101 to the output line 130. A column circuit 140 is connected to the output line 130. A signal from the pixel 100, which is output to the output line 130, is input to the column circuit 140.

FIG. 2 schematically illustrates an overall circuit configuration of the photoelectric conversion apparatus according to this embodiment. Like numbers refer to like parts having like functions in FIGS. 1 and 2.

FIG. 2 illustrates 16 of the pixels 100 arranged in a matrix of 4 rows and 4 columns. A plurality of pixels 100 included in one column is connected to the one output line 130. A row driving circuit 120 supplies a driving signal pRES and a driving signal pREL to the pixels 100. The driving signal pRES is supplied to the gate of the reset transistor 102. The driving signal pREL is supplied to the gate of the selection transistor 105. In response to these driving signals, the reset transistor 102 and the selection transistor 105 are controlled. A plurality of pixels 100 included in one row is connected to a common driving signal line. The driving signal line is a line configured to transmit the driving signal pRES and the driving signal pREL. References such as (n) and (n+1) are given to rows in FIG. 2 for distinction among driving signals supplied to different rows. The same is true for the other drawings.

FIG. 2 schematically illustrates a planar structure of the first electrodes 201 in the photoelectric converting unit 101. The first electrodes 201 configure first terminals (nodes A in FIG. 1) of the photoelectric converting units 101. As illustrated in FIG. 2, the first terminals of the photoelectric converting units 101 of a plurality of pixels 100 included in one row are configured by a common first electrode 201. According to this embodiment, the first electrode 201 is provided for each row. For that, the row driving circuit 120 selects a row to which voltage Vs is to be supplied from the voltage control unit 110. References such as (n) and (n+1) are given to rows for distinction among voltages Vs supplied to different rows.

Each of the output lines 130 is connected to the corresponding column circuit 140. A column driving circuit 150 is configured to drive the column circuits 140 column by column. More specifically, the column driving circuit 150 supplies a driving signal CSEL to the plurality of column circuits 140. References such as (m) and (m+1) are given to columns for distinction among driving signals supplied to different columns. The same is true for the other drawings. Because of this configuration, signals read from rows in parallel can be output sequentially to an output amplifier 170. According to an embodiment in which the photoelectric conversion apparatus includes an analog-digital conversion unit (AD conversion unit) 180, a signal output from the output amplifier 170 is converted to a digital signal by the AD conversion unit 180.

Next, a cross-sectional structure of the photoelectric conversion apparatus according to this embodiment will be described. FIG. 3 schematically illustrates a cross-sectional structure of the photoelectric conversion apparatus. Like numbers refer to like parts having like functions in FIG. 1 and FIG. 3. References are given to gate electrodes of the transistors.

The photoelectric conversion apparatus includes the semiconductor substrate 200. The semiconductor substrate 200 has thereon semiconductor regions 217 including source regions and drain regions of the pixel transistors. Normally, the semiconductor regions 217 may be formed by adding impurities such as donors and acceptors to the semiconductor substrate 200. The pixel transistors may be the reset transistors 102, the amplification transistors 104, and the selection transistors 105.

The semiconductor substrate 200 further has thereon a plurality of wiring layers 202 including gate electrodes of the pixel transistors and conductive members configuring wiring. The wiring layer 202 includes a conductive member 219 connecting the second electrodes 209 and the gate electrodes of the amplification transistors 104, two conductive members 211 and 213 configuring the first capacitances 103 and conductive members configuring the output lines 130. The gate electrodes of the pixel transistors are disposed on the semiconductor substrate 200 through the gate insulating film 230.

The first electrode layer 250 is disposed on the semiconductor substrate 200. The second electrode layer 260 is disposed between the first electrode layer 250 and the semiconductor substrate 200. The photoelectric conversion layer 210 is disposed between the first electrode layer 250 and the second electrode layer 260. The insulating layer 207 is disposed between the photoelectric conversion layer 210 and the second electrode layer 260. The photoelectric conversion layer 210 according to this embodiment includes the accumulation layer 205 and the blocking layer 206. The blocking layer 206 is disposed between the accumulation layer 205 and the insulating layer 207.

As illustrated in FIGS. 1 and 3, the photoelectric converting unit 101 in each of the pixels 100 at least includes the first electrode 201 (common electrode) of the first electrode layer 250, the photoelectric conversion layer 210, the insulating layer 207, and the second electrode 209 (pixel electrode) of the second electrode layer 260. The photoelectric converting unit 101 according to this embodiment further includes an upper blocking layer 203 disposed between the first electrode 201 and the photoelectric conversion layer 210. The upper blocking layer 203 prevents injection of electric charges having the same polarity as that of signal electric charges from the first electrode 201 to the photoelectric conversion layer 210. The upper blocking layer 203 may be omitted.

The first electrode 201 is electrically insulated between rows as illustrated FIG. 2. On the other hand, as illustrated in FIG. 3, the first electrodes 209 in the plurality of pixels 100 included in one row are configured by a common conductive member. For that, the first electrodes 201 are also called common electrodes. The second electrode 209 in one of the pixels 100 are electrically insulated from the second electrodes 209 in the other pixels 100. In other words, a second electrode 209 is provided in each of a plurality of pixels. For that, the second electrode 209 is also called a pixel electrode.

The configuration of the photoelectric converting unit 101 will be described in detail. The first electrode 201 of the photoelectric converting unit 101 is configured by a conductive member having a high optical transmittance. For example, the first electrode 201 may be made with a material such as a compound containing indium and tin such as ITO (Indium Tin Oxide) and a compound such as a ZnO. In this configuration, many beams of light can enter to the photoelectric conversion layer 210. This can increase the sensitivity. As another example, polysilicon or metal having a thickness enough for transmission of a predetermined amount of light may be used as the first electrode 201. Because of lower resistance of metal, an embodiment in which metal is used as a material of the first electrode 201 is more advantageous for lower power consumption or higher driving speed.

The photoelectric conversion layer 210 is configured to photoelectrically convert light entering to the photoelectric conversion layer 210 to electric charges. At least a part of the photoelectric conversion layer 210 may have the photoelectric conversion function. The photoelectric conversion layer 210 may be made of a semiconductor material such as intrinsic amorphous silicon (hereinafter, a-Si), lower density P type a-Si, or lower density N type a-Si. Alternatively, the photoelectric conversion layer 210 may be made of compound semiconductor materials. For example, the compound semiconductor materials may be a III-V group compound semiconductor such as BN, GaAs, GaP, AlSb, and GaAlAsP, a II-VI group compound semiconductor such as CdSe, ZnS, and HdTe. or a IV-VI group compound semiconductor such as PbS, PbTe, and CuO. Alternatively, the photoelectric conversion layer 210 may be made of an organic semiconductor material. The organic semiconductor material may be fullerene, coumarin 6 (C6), rhodamin 6G (R6G), phthalocyanine Zinc (ZnPc), quinacridone, phthalocyanine-based compound, or a naphthalocyanine-based compound, for example. Furthermore, a layer containing quantum dots made of at least one of the semiconductor materials may be used as the photoelectric conversion layer 210. The quantum dots are particles each having a particle size of 20.0 nm or smaller.

In a case where the photoelectric conversion layer 210 is made of a semiconductor material, the semiconductor material may have a lower impurity concentration, or the semiconductor material may be intrinsic. In this configuration, because a depletion layer can be sufficiently extended in the photoelectric conversion layer 210, effects such as an increase of sensitivity and noise reduction can be acquired.

The insulating layer 207 is disposed between the photoelectric conversion layer 210 and the second electrode 209. The insulating layer 207 may be made of an insulative material. For example, the insulating layer 207 may be made of a material such as amorphous silicon oxide (hereinafter, a-SiO), amorphous silicon nitride (a-SiN), and an organic material. The insulating layer 207 may have a thickness enough for preventing transmission of signal electric charges because of a tunnel effect. Because this configuration can reduce leak electric current, noise can be reduced. More specifically, the insulating layer 207 may have a thickness of 50 nm or thicker.

The second electrode 209 is configured by a conductive member of metal, for example. The second electrode 209 may be made of the same material as the conductive member configuring the wiring or a conductive member configuring a pad electrode used for connection to outside. Because of this configuration, the second electrode 209 and the conductive member configuring the wiring or the pad electrode can be formed simultaneously. This can simplify the manufacturing processes.

The upper blocking layer 203 may contain a semiconductor of the same type as that of the semiconductor contained in the photoelectric conversion layer 210, which may be an N-type or P-type semiconductor with a higher impurity concentration than that of the semiconductor contained in the photoelectric conversion layer 210. For example, in a case where the photoelectric conversion layer 210 contains a-Si, the upper blocking layer 203 may contain N-type a-Si with a higher impurity concentration or P-type a-Si with a higher impurity concentration. Because the position of a Fermi level depends on the impurity concentration, a potential barrier may be formed against only one of electrons and holes.

Alternatively, the upper blocking layer 203 may be made of a material different from a material contained in the photoelectric conversion layer 210. In this configuration, a heterojunction can be formed. Because a band gap depends on the material, a potential barrier can be formed against only one of electrons and holes.

The photoelectric conversion layer 210 according to this embodiment includes the accumulation layer 205 and the blocking layer 206. The accumulation layer 205 is configured to accumulate signal electric charges generated by photoelectric conversion. The blocking layer 206 prevents entry of signal electric charges in the accumulation layer 205 to the blocking layer 206. Alternatively, the blocking layer 206 forms a potential barrier against the signal electric charges in the accumulation layer 205. The blocking layer may not necessarily have a photoelectric conversion function. In a case where the photoelectric conversion layer 210 includes another layer configured to perform a photoelectric conversion in addition to the accumulation layer 205 and the blocking layer 206, both of the accumulation layer 205 and the blocking layer 206 may not have the photoelectric conversion function.

The accumulation layer 205 may be made of a material selectable from the materials usable for making the photoelectric conversion layer 210. The blocking layer 206 may be made of a material selectable from the materials usable for making the photoelectric conversion layer 210. The accumulation layer 205 and the blocking layer 206 may be made of materials different from each other to implement the function of the blocking layer 206. The accumulation layer 205 and the blocking layer 206 may be made of a same material having different impurity concentrations or different conductivity types to implement the function of the blocking layer 206.

For convenience of description of this embodiment, the accumulation layer 205 and the blocking layer 206 are described as separate members. However, two different parts of the photoelectric conversion layer 210 being a monolayer may have the functions of the accumulation layer 205 and blocking layer 206, respectively. For example, in a case where the accumulation layer 205 and the blocking layer 206 are made of a same material, the photoelectric conversion layer 210 can be a monolayer. In this embodiment, the accumulation layer 205 and the blocking layer 206 may also be called a first part and a second part of the photoelectric conversion layer 210 as required.

Next, operations of the photoelectric converting unit 101 and functions of the accumulation layer 205 and blocking layer 206 according to this embodiment will be described. An example in which the upper blocking layer 203 is omitted will be described for simple description. Also in an embodiment in which the photoelectric converting unit 101 includes the upper blocking layer 203, the photoelectric converting unit 101 operates in the same manner, and the accumulation layer 205 and the blocking layer 206 function in the same manner.

FIGS. 4A and 4B schematically illustrate energy bands in the photoelectric converting unit 101. FIGS. 4A and 4B illustrate energy bands of the first electrode 201, the accumulation layer 205, the blocking layer 206, the insulating layer 207, and the second electrode 209.

FIGS. 4A and 4B illustrate vertical axes each indicating a potential against electrons. As it goes up in FIGS. 4A and 4B, the height of the potential against electrons increases. Thus, as it goes down in FIGS. 4A and 4B, the voltage increases. For the first electrode 201 and the second electrode 209, the corresponding Fermi levels Ef1 and Ef2 are illustrated. For the accumulation layer 205, the blocking layer 206 and the insulating layer 207, band gaps between conduction bands and valence bands are illustrated.

FIG. 4A illustrates a state in which the photoelectric converting unit 101 is accumulating signal electric charges. In this embodiment, signal electric charges are holes. To achieve a lower potential of the second electrode 209 than the potential of the first electrode 201, a bias voltage Vr is applied between the first electrode 201 and the second electrode 209. In other words, the bias voltage Vr which drifts signal electric charges (holes) from the first electrode layer 250 to the second electrode layer 260 is applied between the first electrode layer 250 and the second electrode layer 260. The voltage control unit 110 applies the voltage Vs to the first terminal of the photoelectric converting unit 101 to control the bias voltage Vr.

FIG. 4A illustrates black circles and white circles indicating electrons and holes generated by photoelectric conversion. Because of the bias voltage Vr, electrons generated in the accumulation layer 205 drift toward the first electrode 201 and are then output to the first electrode 201. On the other hand, because of the bias voltage Vr, holes generated in the accumulation layer 205 drift toward the second electrode 209. The potential barrier at the interface between the first electrode 201 and the accumulation layer 205 can prevent injection of holes from the first electrode 201 to the accumulation layer 205. Thus, the holes generated by photoelectric conversion can be accumulated in the accumulation layer 205.

Here, a potential barrier against holes moving in a direction from the first electrode 201 toward the insulating layer 207 is formed between the accumulation layer 205 and the blocking layer 206. This can prevent entry of holes from the accumulation layer 205 to the blocking layer 206. In other words, the signal electric charges (holes) are accumulated at a location apart from the interface between the photoelectric conversion layer 210 and the insulating layer 207.

A level such as a defect level which traps electric charges may easily occur at the interface between the photoelectric conversion layer 210 and the insulating layer 207. Signal electric charges trapped by a defect level may possibly cause noise such as an afterimage. Because of the configuration of this embodiment, signal electric charges can be accumulated in the accumulation layer 205 apart from the interface between the photoelectric conversion layer 210 and the insulating layer 207. Thus, noise can be reduced.

The upper blocking layer 203 is provided to reduce the amount of holes to be injected from the first electrode 201 to the accumulation layer 205 or to reduce them to zero. As a result, noise can further be reduced.

FIG. 4B illustrates a state in which signal electric charges are output from the photoelectric converting unit 101. A bias voltage Vf is applied between the first electrode 201 and the second electrode 209 so that the potential of the first electrode 201 can be higher than the potential of the second electrode 209. The voltage control unit 110 controls the bias voltage Vf by applying the voltage Vs to the first terminal of the photoelectric converting unit 101.

Because of the bias voltage Vf, holes accumulated in the accumulation layer 205 drift toward the first electrode 201 and are then discharged to the first electrode 201. On the other hand, the potential barrier at the interface between the first electrode 201 and the accumulation layer 205 can prevent injection of electrons from the first electrode 201 to the accumulation layer 205. This means that the potential of the interface between the photoelectric conversion layer 210 and the insulating layer 207 changes in accordance with the amount of discharged holes. The circuit unit in each of the pixels 100 receives a change in potential of the interface as a voltage signal and outputs it to outside of the pixel 100.

A specific configuration will be described which forms the potential barrier between the accumulation layer 205 and the blocking layer 206. FIGS. 5A and 5B schematically illustrate energy bands in the photoelectric converting unit 101. Like numbers refer to like parts in FIGS. 4A and 4B and FIGS. 5A and 5B.

FIG. 5A illustrates an embodiment in which the accumulation layer 205 and the blocking layer 206 form a heterojunction. The accumulation layer 205 contains a semiconductor material different from a semiconductor material contained in the blocking layer 206. The blocking layer 206 has a band gap larger than a band gap in the accumulation layer 205. Due to a difference in size between the band gaps, a potential barrier is formed between the accumulation layer 205 and the blocking layer 206. For forming a heterojunction, the accumulation layer 205 and the blocking layer 206 may be made of organic semiconductor materials. Alternatively, each of the accumulation layer 205 and the blocking layer 206 may contain quantum dots made of semiconductor materials. Without limiting thereto, materials may be selected as required to satisfy the band gap relationship as illustrated in FIG. 5A.

Use of such a heterojunction can prevent entry of holes from the accumulation layer 205 to the blocking layer 206 in a area close to a conduction band. Thus, an operation for discharging signal electric charges as illustrated in FIG. 4B can reduce amount of electrons reaching the interface between the photoelectric conversion layer 210 and the insulating layer 207. When electrons reach the interface, the electrons may possibly be trapped by a defect level. Thus, use of such a heterojunction can reduce noise.

FIG. 5B illustrates an embodiment in which the accumulation layer 205 and the blocking layer 206 form a homojunction. In other words, the accumulation layer 205 and the blocking layer 206 are made of a same semiconductor material.

According to this embodiment, the accumulation layer 205 and the blocking layer 206 are made of a same material having different impurity concentrations. More specifically, the accumulation layer 205 is made of a P type semiconductor material having a high impurity concentration, and the blocking layer 206 is made of a P type semiconductor material having a low impurity concentration. Alternatively, the accumulation layer 205 may be made of an N type semiconductor material having a low impurity concentration, and the blocking layer 206 may be made of an N type semiconductor material having a high impurity concentration.

As another example, the accumulation layer 205 has a conductivity type different from the conductivity type of the blocking layer 206. More specifically, the accumulation layer 205 may be made of a P type semiconductor material, and the blocking layer 206 may be made of an N type semiconductor material. Alternatively, the accumulation layer 205 may be made of an intrinsic semiconductor material, and the blocking layer 206 may be made of an N type semiconductor material. Alternatively, the accumulation layer 205 may be made of a P type semiconductor material, and the blocking layer 206 may be made of an intrinsic semiconductor material. Publicly known schemes may be applicable to the control over the impurity concentrations and the conductivity types of the semiconductor materials. Therefore, the description on the schemes will be omitted.

With such a homojunction, the accumulation layer 205 and the blocking layer 206 can be formed by consecutive processes or one process. Thus, the amount of defects occurring at the interface between the accumulation layer 205 and the blocking layer 206 can be reduced. As a result, noise can be reduced.

Next, an embodiment using electrons as signal electric charges will be described. FIGS. 6A and 6B schematically illustrate energy bands in the photoelectric converting unit 101. FIGS. 6A and 6B illustrate energy bands of the first electrode 201, the accumulation layer 205, the blocking layer 206, the insulating layer 207, and the second electrode 209.

FIGS. 6A and 6B illustrate vertical axes each indicating a potential against electrons. As it goes up in FIGS. 6A and 6B, the height of the potential against electrons increases. Thus, as it goes down in FIGS. 6A and 6B, the voltage increases. For the first electrode 201 and the second electrode 209, the corresponding Fermi levels Ef1 and Ef2 are illustrated. For the accumulation layer 205, the blocking layer 206 and the insulating layer 207, band gaps between conduction bands and valence bands are illustrated.

FIG. 6A illustrates a state in which the photoelectric converting unit 101 is accumulating signal electric charges. In this embodiment, signal electric charges are electrons. To achieve a higher potential of the first electrode 201 than the potential of the second electrode 209, a bias voltage Vr is applied between the first electrode 201 and the second electrode 209. In other words, the bias voltage Vr which drifts signal electric charges (electrons) from the first electrode layer 250 to the second electrode layer 260 is applied between the first electrode layer 250 and the second electrode layer 260. The voltage control unit 110 applies the voltage Vs to the first terminal of the photoelectric converting unit 101 to control the bias voltage Vr.

FIG. 6A illustrates black circles and white circles indicating electrons and holes generated by photoelectric conversion. Because of the bias voltage Vr, holes generated in the accumulation layer 205 drift toward the first electrode 201 and are then output to the first electrode 201. On the other hand, because of the bias voltage Vr, electrons generated in the accumulation layer 205 drift toward the second electrode 209. The potential barrier at the interface between the first electrode 201 and the accumulation layer 205 can prevent injection of electrons from the first electrode 201 to the accumulation layer 205. Thus, the electrons generated by photoelectric conversion can be accumulated in the accumulation layer 205.

Here, a potential barrier against electrons moving in a direction from the first electrode 201 toward the insulating layer 207 is formed between the accumulation layer 205 and the blocking layer 206. This can prevent entry of electrons from the accumulation layer 205 to the blocking layer 206.

In other words, the signal electric charges (holes) are accumulated at a location apart from the interface between the photoelectric conversion layer 210 and the insulating layer 207.

A level such as a defect level which traps electric charges may easily occur at the interface between the photoelectric conversion layer 210 and the insulating layer 207. Signal electric charges trapped by a defect level may possibly cause noise such as an afterimage. Because of the configuration of this embodiment, signal electric charges can be accumulated in the accumulation layer 205 apart from the interface between the photoelectric conversion layer 210 and the insulating layer 207. Thus, noise can be reduced.

The upper blocking layer 203 is provided to reduce the amount of holes to be injected from the first electrode 201 to the accumulation layer 205 or to reduce them to zero. As a result, noise can further be reduced.

FIG. 6B illustrates a state in which signal electric charges are output from the photoelectric converting unit 101. A bias voltage Vf is applied between the first electrode 201 and the second electrode 209 so that the potential of the first electrode 201 can be lower than the potential of the second electrode 209. The voltage control unit 110 controls the bias voltage Vf by applying the voltage Vs to the first terminal of the photoelectric converting unit 101.

Because of the bias voltage Vf, electrons accumulated in the accumulation layer 205 drift toward the first electrode 201 and are then discharged to the first electrode 201. On the other hand, the potential barrier at the interface between the first electrode 201 and the accumulation layer 205 can prevent injection of holes from the first electrode 201 to the accumulation layer 205. This means that the potential of the interface between the photoelectric conversion layer 210 and the insulating layer 207 changes in accordance with the amount of discharged electrons. The circuit unit in each of the pixels 100 receives a change in potential of the interface as a voltage signal and outputs it to outside of the pixel 100.

A specific configuration will be described which forms the potential barrier between the accumulation layer 205 and the blocking layer 206. FIGS. 7A and 7B schematically illustrate energy bands in the photoelectric converting unit 101. Like numbers refer to like parts in FIGS. 6A and 6B and FIGS. 7A and 7B.

FIG. 7A illustrates an embodiment in which the accumulation layer 205 and the blocking layer 206 form a heterojunction. The accumulation layer 205 contains a semiconductor material different from a semiconductor material contained in the blocking layer 206. The blocking layer 206 has a band gap larger than a band gap in the accumulation layer 205. Due to a difference in size between the band gaps, a potential barrier is formed between the accumulation layer 205 and the blocking layer 206. For forming a heterojunction, the accumulation layer 205 and the blocking layer 206 may be made of organic semiconductor materials. Alternatively, each of the accumulation layer 205 and the blocking layer 206 may contain quantum dots made of semiconductor materials. Without limiting thereto, materials may be selected as required to satisfy the band gap relationship as illustrated in FIG. 7A.

Use of such a heterojunction can prevent entry of electrons from the accumulation layer 205 to the blocking layer 206 in a area close to a valence band. Thus, an operation for discharging signal electric charges as illustrated in FIG. 6B can reduce amount of electrons reaching the interface between the photoelectric conversion layer 210 and the insulating layer 207. When electrons reach the interface, the electrons may possibly be trapped by a defect level. Thus, use of such a heterojunction can reduce noise.

FIG. 7B illustrates an embodiment in which the accumulation layer 205 and the blocking layer 206 form a homojunction. In other words, the accumulation layer 205 and the blocking layer 206 are made of a same semiconductor material.

According to this embodiment, the accumulation layer 205 and the blocking layer 206 are made of a same material having different impurity concentrations. More specifically, the accumulation layer 205 is made of a P type semiconductor material having a low impurity concentration, and the blocking layer 206 is made of a P type semiconductor material having a high impurity concentration. Alternatively, the accumulation layer 205 may be made of an N type semiconductor material having a high impurity concentration, and the blocking layer 206 may be made of an N type semiconductor material having a low impurity concentration.

As another example, the accumulation layer 205 has a conductivity type different from the conductivity type of the blocking layer 206. More specifically, the accumulation layer 205 may be made of an N type semiconductor material, and the blocking layer 206 may be made of a P type semiconductor material. Alternatively, the accumulation layer 205 may be made of an intrinsic semiconductor material, and the blocking layer 206 may be made of a P type semiconductor material. Alternatively, the accumulation layer 205 may be made of an N type semiconductor material, and the blocking layer 206 may be made of an intrinsic semiconductor material. Publicly known schemes may be applicable to the control over the impurity concentrations and the conductivity types of the semiconductor materials. Therefore, the description on the schemes will be omitted.

With such a homojunction, the accumulation layer 205 and the blocking layer 206 can be formed by consecutive processes or one process. Thus, the amount of defects occurring at the interface between the accumulation layer 205 and the blocking layer 206 can be reduced. As a result, noise can be reduced.

Next, differences between the upper blocking layer 203 and the blocking layer 206 included in the photoelectric conversion layer 210 will be described. Because they have different functions, they have different structures. The upper blocking layer 203 prevents injection of electric charges having the same polarity as those of the signal electric charges from the first electrode 201 to the photoelectric conversion layer 210. For that, the upper blocking layer 203 forms a potential barrier against electric charges in the first electrode 201. The upper blocking layer 203 is disposed between the first electrode layer 250 (first electrode 201) and the photoelectric conversion layer 210. On the other hand, the blocking layer 206 included in the photoelectric conversion layer 210 forms a potential barrier to prevent signal electric charge in the photoelectric conversion layer 210 from reaching the insulating layer 207. For that, the blocking layer 206 is disposed an internal part of the photoelectric conversion layer 210. Alternatively, the blocking layer 206 may be disposed between the accumulation layer 205 and the insulating layer 207. The upper blocking layer 203 and the blocking layer 206 included in the photoelectric conversion layer 210 are elements different from each other as described above.

According to this embodiment, the photoelectric conversion layer 210 includes the accumulation layer 205 and the blocking layer 206. A potential barrier is formed in the photoelectric conversion layer 210 to prevent signal electric charges in the photoelectric conversion layer 210 from reaching an interface between the photoelectric conversion layer 210 and the insulating layer 207. Because of this configuration, noise can be reduced.

Second Embodiment

Another embodiment will be described. This embodiment is different from the first embodiment in node for which a voltage control unit controls voltage. Differences from the first embodiment will only be described. Any repetitive description regarding the first and this embodiments will be omitted.

FIG. 8 schematically illustrates a configuration of a pixel 100 in a photoelectric conversion apparatus according to this embodiment. Like numbers refer to like parts having like functions in FIG. 1 and FIG. 8.

According to this embodiment, the first electrode 201 in the photoelectric converting unit 101 is connected to a power supply VS. The power supply VS supplies a voltage Vs to the first electrode 201. The first capacitance 103 has the second terminal connected to the node C. A voltage Vd is supplied from the voltage control unit 410 to the node C. Because, except for this point, the configuration of the pixel 100 and the configuration of the photoelectric converting unit 101 are the same as those in the first embodiment, any repetitive description will be omitted.

According to this embodiment, while the photoelectric converting unit 101 is accumulating signal electric charges, the voltage control unit 110 applies the voltage Vd to the second terminal of the first capacitance 103 to control the bias voltage Vr. When signal electric charges are discharged from the photoelectric converting unit 101, the voltage control unit 410 applies the voltage Vd to the second terminal of the first capacitance 103 to control the bias voltage Vf. Because the other operations are the same as those of the first embodiment, any repetitive description will be omitted.

According to this embodiment, the photoelectric conversion layer 210 includes the accumulation layer 205 and the blocking layer 206 like the first embodiment. A potential barrier is formed in the photoelectric conversion layer 210 to prevent signal electric charges in the photoelectric conversion layer 210 from reaching an interface between the photoelectric conversion layer 210 and the insulating layer 207. Because of this configuration, noise can be reduced.

Third Embodiment

Another embodiment will be described. This embodiment is different from the first embodiment and the second embodiment in that a pixel includes a photoelectric converting unit and an electric charge holding unit configured to hold electric charges generated in the photoelectric converting unit. Differences from the first or second embodiment will only be described. Any repetitive description regarding parts common in the first or second embodiment and this embodiment will be omitted.

An embodiment of the present invention will be described. FIG. 9 illustrates a schematic view of a pixel 100 according to this embodiment. While FIG. 9 illustrates only one pixel 100, the photoelectric conversion apparatus of this embodiment includes a plurality of pixels 100. Like numbers refer to like parts having like functions in FIG. 1 or 8 and 9, and any repetitive detail description will be omitted.

The pixel 100 includes a photoelectric converting unit 101, an electric charge transferring unit 510, and an electric charge holding unit 520. Each of the photoelectric converting unit 101, the electric charge transferring unit 510, and the electric charge holding unit 520 includes a first electrode 201 included in the first electrode layer 250, an upper blocking layer 203, and a photoelectric conversion layer 210, and an insulating layer 207. The photoelectric conversion layer 210 includes the accumulation layer 205 and the blocking layer 206. Because the upper blocking layer 203, the insulating layer 207, the photoelectric conversion layer 210, the accumulation layer 205 included in the photoelectric conversion layer 210 and the blocking layer 206 according to this embodiment are the same as those of the first embodiment, any repetitive descriptions will be omitted.

The first electrode 201 is connected to a power supply VS. The power supply VS supplies a voltage Vs to the first electrode 201. According to this embodiment, the first electrode 201 applies a bias voltage to both of the photoelectric converting unit 101 and the electric charge holding unit 520. For that, the first electrode 201 is configured by a conductive member continuously extending over the photoelectric converting unit 101 and over the electric charge holding unit 520. From another point of view, the first electrode 201 has a first part which applies a bias voltage to the photoelectric converting unit 101, and the first electrode 201 further has a second part which applies a bias voltage to the electric charge holding unit 520.

According to this embodiment, the photoelectric converting unit 101 includes a second electrode 209 included in the second electrode layer 260. The electric charge transferring unit 510 includes a third electrode 512 included in the second electrode layer 260. The electric charge holding unit 520 includes a fourth electrode 522 included in the second electrode layer 260.

The second electrode 209 is connected to a power supply VP. The power supply VP supplies a voltage Vp to the second electrode 209. Because of the voltage Vs and the voltage Vp, a bias voltage is applied for accumulating signal electric charges to the photoelectric converting unit 101.

The third electrode 512 is connected to the voltage control unit 514. The voltage control unit 514 supplies a control voltage to the third electrode 512 so that electric charges accumulated in the photoelectric converting unit 101 can be transferred to the electric charge holding unit 520.

The fourth electrode 522 is connected to the voltage control unit 524 through the first capacitance 103. With the voltage output by the voltage control unit 524, the electric charge holding unit 520 controls an operation for holding signal electric charges and an operation for outputting signal electric charges in the electric charge holding unit 520.

A bias voltage for a direction in which signal electric charges are drifted from the first electrode 201 toward the fourth electrode 522 is applied between the first electrode 201 and the fourth electrode 522 so that the electric charge holding unit 520 holds the signal electric charges. In other words, the bias voltage used for holding signal electric charges in the electric charge holding unit 520 is the same as the bias voltage Vr for accumulating signal electric charges in the photoelectric converting unit 101 according to the first embodiment. According to this embodiment, a light shield layer 530 is configured to shield the electric charge holding unit 520 from light, as will be described below. Thus, the amount of electric charges generated by photoelectric conversion in the electric charge holding unit 520 can be reduced.

A bias voltage which drifts signal electric charges from the fourth electrode 522 to the first electrode 201 is applied so that signal electric charges in the electric charge holding unit 520 can be discharged. In other words, the bias voltage used for discharging signal electric charges from the electric charge holding unit 520 is the same as the bias voltage Vf for discharging signal electric charges from the photoelectric converting unit 101 according to the first embodiment.

The fourth electrode 522 is connected to a gate of the amplification transistor 104. A change of the potential at the photoelectric conversion layer 210 caused by the discharge of signal electric charges is read to the circuit unit as a voltage signal. This point is common to the first embodiment.

The light shield layer 530 configured to shield incident light is disposed over the electric charge transferring unit 510 and over the electric charge holding unit 520. The light shield layer 530 is partially disposed over the electric charge transferring unit 510 so that generation of electric charges can be prevented in the electric charge transferring unit 510 while electric charges are being transferred. This, noise can be reduced. The light shield layer 530 is partially disposed over the electric charge holding unit 520 so that generation of electric charges can be prevented in the electric charge holding unit 520 while electric charges are being held in the charge holding unit 520. This, noise can be reduced.

According to the first embodiment and the second embodiment, signal electric charges generated by photoelectric conversion can be accumulated in the accumulation layer 205. After that, when a signal is read out, the accumulated signal electric charges can be discharged to the first electrode layer 250. According to this embodiment on the other hand, before a signal is read out, accumulated signal electric charges are transferred inside the photoelectric conversion layer 210.

Because of this configuration, the electric charge holding unit 520 can hold the signal electric charges generated in the photoelectric converting unit 101 at a location different from the photoelectric converting unit 101. With the electric charges held in the electric charge holding unit 520, a global electronic shutter operation can be performed.

According to this embodiment, the photoelectric conversion layer 210 in the photoelectric converting unit 101 includes the accumulation layer 205 and the blocking layer 206. For that, signal electric charges are accumulated near an interface between the accumulation layer 205 and the blocking layer 206. As a result, noise can be reduced like the first embodiment.

Furthermore, according to this embodiment, the photoelectric conversion layer 210 in the electric charge transferring unit 510 includes the accumulation layer 205 and the blocking layer 206. Because of this configuration, a transfer path for signal electric charges is formed apart from the interface between the photoelectric conversion layer 210 and the insulating layer 207. Therefore, the possibility that signal electric charges are trapped by a defect level occurring at the interface while signal electric charges are being transferred can be reduced. As a result, noise can be reduced. Alternatively, because signal electric charges are transferred along a path having fewer defect levels, the transfer speed can be improved. As a result, the speed of driving can be increased.

Furthermore, according to this embodiment, the photoelectric conversion layer 210 in the electric charge holding unit 520 includes the accumulation layer 205 and the blocking layer 206. Thus, signal electric charges are held near an interface between the accumulation layer 205 and the blocking layer 206. Therefore, the possibility that signal electric charges are trapped by a defect level occurring at the interface while the electric charge holding unit 520 is holding signal electric charges. As a result, noise can be reduced.

According to this embodiment, a global electronic shutter operation can be implemented, and, at the same time, noise can be reduced or the speed of the operation can be increased.

The example has been described in which each of the photoelectric converting unit 101, the electric charge transferring unit 510, and the electric charge holding unit 520 includes the accumulation layer 205 and the blocking layer 206. According to a variation example of this embodiment, any one or two of the photoelectric converting unit 101, the electric charge transferring unit 510, and the electric charge holding unit 520 may include the accumulation layer 205 and the blocking layer 206. Also according to this variation example, a global electronic shutter operation can be implemented, and, at the same time, noise can be reduced or the speed of the operation can be increased.

Fourth Embodiment

Another embodiment will be described. This embodiment is different from the third embodiment in that a plurality of separate first electrodes 201a and 201b are disposed on the photoelectric conversion layer 210. This embodiment is further different from the third embodiment in that the electric charge transferring unit 510 does not include the voltage control unit 514 connected to the third electrode 512 and the third electrode 512. Hereinafter, differences from the third embodiment will be described. Any repetitive description regarding parts common in one of the first to third embodiments and this embodiment will be omitted.

FIG. 10 illustrates a schematic view of one of the pixels 100 in the imaging apparatus according to this embodiment. Like numbers refer to like parts having like functions in FIG. 1, 8 or 9 and FIG. 10, any repetitive detail description will be omitted.

According to this embodiment, the first electrode layer 250 includes a first electrode 201a disposed in the photoelectric converting unit 101 and a first electrode 201b disposed in the electric charge holding unit 520. The first electrode 201a and the second electrode 201b are separated from each other. Correspondingly to the separate first electrode 201a and second electrode 201b, an upper blocking layer 203a disposed in the photoelectric converting unit 101 is separated from a upper blocking layer 203b disposed in the electric charge holding unit 520. The electric charge transferring unit 510 does not include an electrode included in the first electrode layer 250 and the upper blocking layer 203. In this configuration, voltage can be supplied to the first electrode 201a and the second electrode 201b independently. Thus, the transfer of signal electric charges can be performed efficiently.

The light shield layer 530 is partially disposed between the two first electrodes 201a and 201b. The light shield layer 530 is made of an insulator such as a resin. Because of this configuration, the amount of light entering to the electric charge holding unit 520 can be reduced.

The electric charge transferring unit 510 does not include an electrode (such as third electrode 512 in the third embodiment) in the second electrode layer 260 and the voltage control unit (such as the voltage control unit 514 in the third embodiment) configured to control voltage of the electrodes. This, the circuit can be simplified. Also according to this embodiment, the voltage of the fourth electrode 522 is controlled so that signal electric charges can be transferred from the photoelectric converting unit 101 to the electric charge holding unit 520.

According to this embodiment, a global electronic shutter operation can be implemented, and, at the same time, noise can be reduced or the speed of the operation can be increased, like the third embodiment.

Fifth Embodiment

Another embodiment will be described. This embodiment is different from the first to fourth embodiments in that each pixel has an electric-charge discharging unit. Differences from the first to fourth embodiments will only be described. Any repetitive description regarding parts common in one of the first to fourth embodiments and this embodiment will be omitted.

FIG. 11 illustrates a schematic view of one of pixels 100 in an imaging apparatus according to this embodiment. While FIG. 11 illustrates one pixel 100, the imaging apparatus of this embodiment includes a plurality of pixels 100. Like numbers refer to like parts having like functions in FIG. 1, 8, 9 or 10 and FIG. 11, and any repetitive detail description will be omitted.

The pixel 100 includes a photoelectric converting unit 101, an electric charge transferring unit 510, and an electric-charge discharging unit 550. According to this embodiment, the second electrode 209 included in the photoelectric converting unit 101 is connected to the gate of the amplification transistor 104 and the first capacitance 103. This point is common to the first or second embodiment. The electric charge transferring unit 510 according to this embodiment is the same as the electric charge transferring unit 510 of this third embodiment. The electric charge transferring unit 510 of this embodiment may be the electric charge transferring unit 510 of the fourth embodiment.

The electric-charge discharging unit 550 includes a first electrode 201 included in a first electrode layer 250, an upper blocking layer 203, a photoelectric conversion layer 210, and a discharge electrode 552 included in a second electrode layer 260. The discharge electrode 552 is connected to a power supply VD. The power supply VD supplies a voltage Vd to the discharge electrode 552.

In the electric-charge discharging unit 550, the accumulation layer 205 included in the photoelectric conversion layer 210 is in contact with the discharge electrode 552. For example, the insulating layer 207 has a contact hole, and the accumulation layer 205 is disposed in the contact hole. In a case where the blocking layer 206 is made of a material different from that of the accumulation layer 205, the blocking layer 206 also has a contact hole. Alternatively, in a case where the accumulation layer 205 and the blocking layer 206 are made of a same material, an impurity may be partially added to the photoelectric conversion layer 210 to form the blocking layer 206 according to this embodiment. The accumulation layer 205 and blocking layer 206 are the same as those of the first embodiment except that the accumulation layer 205 is in contact with the discharge electrode 552.

Because of this configuration, signal electric charges transferred from the photoelectric converting unit 101 to the electric-charge discharging unit 550 are discharged to the discharge electrode 552.

First, with a bias voltage applied to the first electrode 201 and the second electrode 209, signal electric charges generated by photoelectric conversion are accumulated in the accumulation layer 205 of the photoelectric converting unit 101. The bias voltage here is the same as the bias voltage Vr used for accumulating signal electric charges in the first embodiment.

Next, a control voltage is supplied to the third electrode 512 of the electric charge transferring unit 510 so that signal electric charges in the photoelectric converting unit 101 are transferred to the electric-charge discharging unit 550. The transferred signal electric charges are discharged to the discharge electrode 552, as described above. On the other hand, in the photoelectric converting unit 101, the potential of the photoelectric conversion layer 210 changes in accordance with the amount of transferred signal electric charges. The change in potential is read by the circuit unit in the pixel 100.

According to this embodiment, signal electric charges are transferred in a direction along a surface of the semiconductor substrate 200 to read out a signal, as described above. For example, in a case where the photoelectric conversion layer 210 is thick enough for acquiring sensitivity, a signal can be read out at a high speed. In the photoelectric converting unit 101, the photoelectric conversion layer 210 includes the accumulation layer 205 and the blocking layer 206. Thus, noise can be reduced, and, at the same time, a signal can be read out at a high speed.

Sixth Embodiment

Another embodiment will be described. This embodiment is different from the first to fifth embodiments in that signal electric charges generated by photoelectric conversion are directly input to an input node of an amplifying unit. Differences from the first to fifth embodiments will only be described. Any repetitive description regarding parts common in any one of the first to fifth embodiments and this embodiment will be omitted.

FIG. 12 illustrates a schematic view of one of the pixels 100 in an imaging apparatus according to this embodiment. FIG. 12 illustrates only one pixel 100, the imaging apparatus according to this embodiment includes a plurality of pixels 100. Like numbers refer to like parts having like functions in FIG. 1, 8, 9, 10 or 11 and FIG. 12, and any repetitive detail description will be omitted.

The pixel 100 includes a photoelectric converting unit 101, an electric charge transferring unit 510, and an electric-charge reading unit 560. According to this embodiment, the photoelectric converting unit 101 includes a second electrode 209 connected to a power supply VP. The power supply VP supplies a voltage Vp to the second electrode 209. This point is common to the third embodiment or the fourth embodiment. The electric charge transferring unit 510 according to this embodiment is the same as the electric charge transferring unit 510 according to the third embodiment. The electric charge transferring unit 510 according to this embodiment may be the electric charge transferring unit 510 according to the fourth embodiment.

The electric-charge reading unit 560 includes a first electrode 201 included in the first electrode layer 250, an upper blocking layer 203, a photoelectric conversion layer 210, and a read electrode 562 included in the second electrode layer 260. The read electrode 562 is connected to a gate of the amplification transistor 104.

In the electric-charge reading unit 560, the accumulation layer 205 included in the photoelectric conversion layer 210 is in contact with the read electrode 562. For example, the insulating layer 207 has a contact hole, and the accumulation layer 205 is disposed in the contact hole. In a case where the blocking layer 206 is made of a material different from the accumulation layer 205, the blocking layer 206 also has a contact hole. Alternatively, in a case where the accumulation layer 205 and the blocking layer 206 are made of a same material, an impurity is partially added to the photoelectric conversion layer 210 so that the blocking layer 206 according to this embodiment can be formed. The accumulation layer 205 and blocking layer 206 are the same as those of the first embodiment except that the accumulation layer 205 is in contact with the read electrode 562.

Because of this configuration, signal electric charges transferred from the photoelectric converting unit 101 to the electric-charge reading unit 560 are input to the gate of the amplification transistor 104 through the read electrode 562. Thus, the circuit unit can directly read out the accumulated signal electric charges.

According to this embodiment, as described above, signal electric charges are transferred in a direction along a surface of the semiconductor substrate 200 so that a signal can be read out. For example, in a case where the photoelectric conversion layer 210 is thick enough for acquiring sensitivity, a signal can be read out at a high speed. In the photoelectric converting unit 101, the photoelectric conversion layer 210 includes the accumulation layer 205 and the blocking layer 206. Thus, noise can be reduced, and, at the same time, a signal can be read out at a high speed.

Seventh Embodiment

An embodiment of an imaging system according to the present invention will be described. The imaging system may be a digital still camera, a digital camcorder, a camera head, a copier, a facsimile, a cellular phone, a vehicle-mounted camera, or an observation satellite, for example. FIG. 13 illustrates a block diagram of a digital still camera as an example of the imaging system.

FIG. 13 illustrates a barrier 1001 configured to protect a lens, a lens 1002 configured to cause the photoelectric conversion apparatus 1004 to focus on an optical image of an object, and a diaphragm 1003 usable for adjusting the amount of light passing through the lens 1002. FIG. 13 further illustrates a photoelectric conversion apparatus 1004 according to any one of the aforementioned embodiments. The photoelectric conversion apparatus 1004 is configured to convert an optical image focused with the lens 1002 to image data. Here, a semiconductor substrate in the photoelectric conversion apparatus 1004 has an AD conversion unit thereon. A signal processing unit 1007 is configured to perform a correction on imaged data output from the photoelectric conversion apparatus 1004 and compress the data. Referring to FIG. 13, a timing generating unit 1008 is configured to output timing signals to the photoelectric conversion apparatus 1004 and the signal processing unit 1007, and an overall control unit 1009 is configured to control the digital still camera overall. A frame memory unit 1010 is configured to temporarily store image data. An interface unit 1011 is configured to write or read to or from a record medium. A record medium 1012 is detachably mounted such as a semiconductor memory to or from which imaged data can be written or read. An interface unit 1013 is configured to communicate with an external computer, for example. Here, such a timing signal may be input external to the imaging system, and the imaging system may at least have the photoelectric conversion apparatus 1004, and the signal processing unit 1007 configured to process an imaged signal output from the photoelectric conversion apparatus 1004.

According to this embodiment, the photoelectric conversion apparatus 1004 and the AD conversion unit are provided on different semiconductor substrates. However, the photoelectric conversion apparatus 1004 and the AD conversion unit may be provided on one semiconductor substrate. The photoelectric conversion apparatus 1004 and the signal processing unit 1007 may be provided on one semiconductor substrate.

Each of the pixels 100 may include a first photoelectric converting unit 101A and a second photoelectric converting unit 101B. The signal processing unit 1007 may process a signal based on electric charges generated in the first photoelectric converting unit 101A and a signal based on electric charges generated in the second photoelectric converting unit 101B and acquire distance information from the photoelectric conversion apparatus 1004 to an object.

In an embodiment of the imaging system, the photoelectric conversion apparatus 1004 may be a photoelectric conversion apparatus according to any one of the first to sixth embodiments. Because of this configuration, an image with reduced noise can be acquired.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-023061, filed Feb. 9, 2016, which is hereby incorporated by reference herein in its entirety.

The invention claimed is:

1. A photoelectric conversion apparatus comprising:
   a semiconductor substrate;
   a first electrode layer disposed on the semiconductor substrate;
   a second electrode layer disposed between the first electrode layer and the semiconductor substrate;
   an accumulation layer disposed between the first electrode layer and the second electrode layer and configured to accumulate signal electric charges generated by photoelectric conversion;
   an insulating layer disposed between the accumulation layer and the second electrode layer;
   a blocking layer disposed between the accumulation layer and the insulating layer and configured to prevent the signal electric charges in the accumulation layer from reaching the insulating layer; and
   a circuit unit disposed in the semiconductor substrate, the circuit unit being connected to the second electrode layer to receive a signal based on the signal electric charges.

2. The photoelectric conversion apparatus according to claim 1, wherein the accumulation layer and the blocking layer are made of a same semiconductor material.

3. The photoelectric conversion apparatus according to claim 2, wherein the accumulation layer has an impurity concentration different from an impurity concentration of the blocking layer.

4. The photoelectric conversion apparatus according to claim 2, wherein the accumulation layer has a first conductivity type; and
   the blocking layer has a second conductivity type different from the first conductivity type.

5. The photoelectric conversion apparatus according to claim 1, wherein the accumulation layer is made of a first semiconductor material; and the blocking layer is made of a second semiconductor material different from the first semiconductor material.

6. The photoelectric conversion apparatus according to claim 5, wherein the accumulation layer has a band gap different from a band gap in the blocking layer.

7. The photoelectric conversion apparatus according to claim 5, wherein the accumulation layer and the blocking layer form a heterojunction.

8. The photoelectric conversion apparatus according to claim 1, wherein a voltage to drift the signal electric charges from the first electrode layer to the second electrode layer is applied between the first electrode layer and the second electrode layer.

9. The photoelectric conversion apparatus according to claim 1, further comprising a second blocking layer disposed between the first electrode layer and the accumulation layer and configured to prevent injection of electric charges having a same polarity as that of the signal electric charges from the first electrode layer to the accumulation layer.

10. An imaging system comprising:
the photoelectric conversion apparatus according to claim 1; and
a signal processing apparatus configured to process a signal from the photoelectric conversion apparatus.

11. A photoelectric conversion apparatus comprising:
a semiconductor substrate;
a first electrode layer disposed on the semiconductor substrate;
a second electrode layer disposed between the first electrode layer and the semiconductor substrate;
a photoelectric conversion layer disposed between the first electrode layer and the second electrode layer;
an insulating layer disposed between the photoelectric conversion layer and the second electrode layer; and
a circuit unit disposed in the semiconductor substrate, the circuit unit being connected to the second electrode layer to receive a signal based on signal electric charges generated in the photoelectric conversion layer,
wherein a potential barrier is formed in the photoelectric conversion layer against the signal electric charges moving in a direction from the first electrode layer toward the insulating layer.

12. The photoelectric conversion apparatus according to claim 11, wherein the potential barrier is formed while a voltage to drift the signal electric charges from the first electrode layer to the second electrode layer is being applied between the first electrode layer and the second electrode layer.

13. The photoelectric conversion apparatus according to claim 11, wherein the potential barrier is formed while the photoelectric conversion layer accumulating the signal electric charges.

14. The photoelectric conversion apparatus according to claim 11, wherein the photoelectric conversion layer is made of a semiconductor material;
the photoelectric conversion layer includes a first part having a first impurity concentration and a second part having a second impurity concentration different from the first impurity concentration; and
the second part has the potential barrier against the signal electric charges in the first part.

15. The photoelectric conversion apparatus according to claim 11, wherein the photoelectric conversion layer includes a first part made of a first semiconductor material and a second part made of a second semiconductor material different from the first semiconductor material; and the second part has the potential barrier against the signal electric charges in the first part.

16. The photoelectric conversion apparatus according to claim 15, wherein the first part has a band gap different from a band gap of the second part.

17. The photoelectric conversion apparatus according to claim 11, further comprising a second blocking layer disposed between the first electrode layer and the photoelectric conversion layer, the second blocking layer being configured to prevent injection of electric charges having a same polarity as that of the signal electric charges from the first electrode layer to the photoelectric conversion layer.

18. The photoelectric conversion apparatus according to claim 1, wherein the second electrode layer at least includes two electrically isolated electrodes; and
a voltage or voltages of one or both of the at least two electrodes is or are controlled to transfer the signal electric charges.

19. The photoelectric conversion apparatus according to claim 18, further comprising:
a photoelectric converting unit including one of the at least two electrodes;
an electric charge holding unit including the other one of the at least two electrodes; and
a light shield layer configured to shield the electric charge holding unit from light,
wherein the signal electric charges in the photoelectric converting unit are transferred to the electric charge holding unit.

20. The photoelectric conversion apparatus according to claim 11, wherein
the second electrode layer at least includes two electrically isolated electrodes; and
a voltage or voltages of one or both of the at least two electrodes is or are controlled to transfer the signal electric charges.

21. The photoelectric conversion apparatus according to claim 20, further comprising:
a photoelectric converting unit including one of the at least two electrodes;
an electric charge holding unit including the other one of the at least two electrodes; and
a light shield layer configured to shield the electric charge holding unit from light,
wherein the signal electric charges in the photoelectric converting unit are transferred to the electric charge holding unit.

22. An imaging system comprising:
the photoelectric conversion apparatus according to claim 11; and
a signal processing apparatus configured to process a signal from the photoelectric conversion apparatus.

23. A photoelectric conversion apparatus comprising:
a semiconductor substrate;
a first electrode layer disposed on the semiconductor substrate;
a second electrode layer disposed between the first electrode layer and the semiconductor substrate;
an accumulation layer disposed between the first electrode layer and the second electrode layer and configured to accumulate signal electric charges generated by photoelectric conversion;
an insulating layer disposed between the accumulation layer and the second electrode layer;

a blocking layer disposed between the accumulation layer and the insulating layer and having a potential barrier against the signal electric charges in the accumulation layer; and a circuit unit disposed in the semiconductor substrate, the circuit unit being connected to the second electrode layer to receive a signal based on the signal electric charges.

24. The photoelectric conversion apparatus according to claim 23,
wherein the accumulation layer and the blocking layer are made of a same semiconductor material.

25. The photoelectric conversion apparatus according to claim 24,
wherein the accumulation layer has an impurity concentration different from an impurity concentration of the blocking layer.

26. The photoelectric conversion apparatus according to claim 24,
wherein the accumulation layer has a first conductivity type; and
the blocking layer has a second conductivity type different from the first conductivity type.

27. The photoelectric conversion apparatus according to claim 23,
wherein the accumulation layer is made of a first semiconductor material; and
the blocking layer is made of a second semiconductor material different from the first semiconductor material.

28. The photoelectric conversion apparatus according to claim 27, wherein the accumulation layer has a band gap different from a band gap in the blocking layer.

29. The photoelectric conversion apparatus according to claim 27, wherein the accumulation layer and the blocking layer form a heterojunction.

30. The photoelectric conversion apparatus according to claim 23, wherein a voltage to drift the signal electric charges from the first electrode layer to the second electrode layer is applied between the first electrode layer and the second electrode layer.

31. The photoelectric conversion apparatus according to claim 23, further comprising a second blocking layer disposed between the first electrode layer and the accumulation layer and configured to prevent injection of electric charges having a same polarity as that of the signal electric charges from the first electrode layer to the accumulation layer.

32. The photoelectric conversion apparatus according to claim 23, wherein
the second electrode layer at least includes two electrically isolated electrodes; and
a voltage or voltages of one or both of the at least two electrodes is or are controlled to transfer the signal electric charges.

33. The photoelectric conversion apparatus according to claim 32, further comprising:
a photoelectric converting unit including one of the at least two electrodes;
an electric charge holding unit including the other one of the at least two electrodes; and
a light shield layer configured to shield the electric charge holding unit from light,
wherein the signal electric charges in the photoelectric converting unit are transferred to the electric charge holding unit.

34. An imaging system comprising:
the photoelectric conversion apparatus according to claim 23; and
a signal processing apparatus configured to process a signal from the photoelectric conversion apparatus.

* * * * *